United States Patent
Schreder et al.

(10) Patent No.: US 8,062,753 B2
(45) Date of Patent: Nov. 22, 2011

(54) METHOD FOR PRODUCING AN OPTICAL COMPONENT, OPTICAL COMPONENT PRODUCED ACCORDING TO THE METHOD AND DEVICES COMPRISING SUCH COMPONENTS

(75) Inventors: Bianca Schreder, Frankfurt am Main (DE); Jose Zimmer, Ingelheim (DE); Edgar Pawlowski, Stadecken-Elsheim (DE)

(73) Assignee: Schott AG, Mainz (DE)

( * ) Notice: Subject to any disclaimer, the term of this patent is extended or adjusted under 35 U.S.C. 154(b) by 541 days.

(21) Appl. No.: 11/323,878

(22) Filed: Dec. 30, 2005

(65) Prior Publication Data
US 2006/0171033 A1 Aug. 3, 2006

(30) Foreign Application Priority Data

Dec. 31, 2004 (DE) .................... 10 2004 063 823
Jan. 25, 2005 (DE) .................... 10 2005 003 594

(51) Int. Cl.
*B32B 17/06* (2006.01)
(52) U.S. Cl. .................... 428/426; 428/221; 430/290
(58) Field of Classification Search .................. 428/426, 428/221; 430/290, 321, 945; 385/123, 141
See application file for complete search history.

(56) References Cited

U.S. PATENT DOCUMENTS

| | | | |
|---|---|---|---|
| 3,784,386 A * | 1/1974 | Araujo et al. ................. 501/13 |
| 4,734,118 A | 3/1988 | Marechal et al. ............... 65/102 |
| 4,854,958 A | 8/1989 | Marechal et al. ................. 65/64 |
| 4,969,944 A | 11/1990 | Marechal et al. ............... 65/104 |
| 5,155,631 A * | 10/1992 | Snyder et al. ................. 359/708 |
| 5,208,701 A * | 5/1993 | Maeda .......................... 359/574 |
| 5,846,638 A | 12/1998 | Meissner |
| 6,046,123 A * | 4/2000 | Ricoult .......................... 501/75 |
| 6,313,958 B1 * | 11/2001 | Ogawa ......................... 359/745 |
| 6,421,178 B1 | 7/2002 | Lissotschenko et al. ...... 359/559 |
| 6,573,026 B1 * | 6/2003 | Aitken et al. ................. 430/290 |
| 6,593,260 B2 * | 7/2003 | Nomura ......................... 501/48 |
| 2003/0015284 A1 * | 1/2003 | Merdan et al. ............. 156/272.2 |
| 2003/0061833 A1 * | 4/2003 | Menzel et al. .................. 65/102 |
| 2003/0231536 A1 | 12/2003 | Mizuno et al. |
| 2004/0180773 A1 * | 9/2004 | Schreder et al. ................... 501/7 |

FOREIGN PATENT DOCUMENTS

| | | |
|---|---|---|
| DE | 4338969 | 12/1994 |
| DE | 19500513 | 7/1996 |
| DE | 19846532 | 5/2000 |
| EP | 0961152 | 12/1999 |

(Continued)

OTHER PUBLICATIONS

"Analysis of the Optical Image Quality by means of Spot Diagram", 1997, (http://www.geocities.com/ivankrat/spotdgr.html).*

(Continued)

*Primary Examiner* — Jennifer McNeil
*Assistant Examiner* — Lauren Robinson
(74) *Attorney, Agent, or Firm* — Ohlandt, Greeley, Ruffiero & Perle, LLP

(57) ABSTRACT

An optical component having a diffractive element and/or refractive element is provided. The optical component includes a photosensitive glass and/or a photosensitive glass ceramic and a plurality of structures influencing propagation of light in at least a part of the photosensitive glass and/or a photosensitive glass ceramic.

25 Claims, 15 Drawing Sheets

FOREIGN PATENT DOCUMENTS

| | | |
|---|---|---|
| JP | 60205402 A | 10/1986 |
| JP | 7056006 A | 3/1995 |
| WO | WO 00/19248 | 4/2000 |
| WO | WO 01/44871 | 6/2001 |
| WO | PCT/EP02/03283 | 3/2002 |

OTHER PUBLICATIONS

Office Action dated Sep. 30, 2010 corresponding to German Patent Application No. 20 2005 003 594.9-51.

* cited by examiner

METHOD FOR PRODUCING AN OPTICAL COMPONENT, OPTICAL COMPONENT PRODUCED ACCORDING TO THE METHOD AND DEVICES COMPRISING SUCH COMPONENTS

CROSS-REFERENCE TO RELATED APPLICATIONS

This application claims the benefit under 35 U.S.C. §119 (a) of German Application No. 10 2004 063 823.3 filed on Dec. 31, 2004 and German Application No. 10 2005 003 594.9 filed on Jan. 25, 2005, the entire contents of both which are incorporated by reference herein.

BACKGROUND OF THE INVENTION

1. Field of the Invention

The invention relates to a method for producing an optical component, to the optical component produced according to the method and to devices comprising such components.

2. Description of Related Art

Optical components, which are based on the guiding and manipulation of light by structures such as waveguides and gratings, are already well known for example in the fields of sensors and telecommunications.

Beam shaping refractive devices are furthermore used, for example in imaging or illuminating systems, and especially for beam shaping of the light emitted by semiconductor lasers.

Devices for beam shaping of the light from high-power lasers are conventionally constructed in: an elaborate way with multilens refractive systems (for example lens and/or prism arrays), see for example DE 195 00 513 or DE 198 46 532 and EP 0 961 152. These optics are used to carry out beam shaping, in particular circularization of the elliptical beam cone between the so-called fast and slow axes.

Furthermore, PCT/EP02/03283 proposes linear prism fields for correcting the light emerging from a laser array. In this case, respectively different tilted prisms are intended to compensate for a lateral offset of individual lasers, known as a "smile", in which the respective light exit surface of the individual laser lies not on a straight line but on a curved line.

In general, however, lens and prism arrays are difficult to manufacture and adjust, and have step-shaped lateral surfaces between the respective prisms, which are detrimental to the light propagation owing to reflection. Further multiple prism arrangements are also known from U.S. Pat. No. 6,421,178 B1.

WO 00/19248 describes a biconcave micro-cylinder lens system, in which at least two aspherical lenses are produced with high accuracy.

It is known from the standard textbook "High-Power Diode Lasers" by R. Diehl, Springer (2000) that for exact fast axis collimation (residual divergence <5 mrad) of diode laser emitters or emitter arrays by means of purely refractive optics, it is necessary to use materials of high refractive index (generally >1.7) in conjunction with aspherical surfaces. Disadvantages of such systems are not only the high outlay for producing the aspherical surfaces to be adjusted relative to each other, but also the difficulty of exact mounting, for example in exact alignment with a stationary light source.

In many technical application fields, an increasing need for high-performance optical systems is developing. The spectrum comprises, for example, laser technology, printing technology, solar technology, biochemistry, sensors, adaptive optical systems, optical computers, optical memory systems, digital cameras, two- and three-dimensional image reproduction, lithography and measuring technology.

In order to compensate for optical errors, or in order to produce particular beam profiles or complicated geometries, optical systems having a plurality of optical components are often necessary.

The production of individual optical components by shaping glass material is known, for example, from U.S. Pat. Nos. 4,734,118, 4,854,958 or 4,969,944. In order to join two optical components together to form an optical system, they are typically bonded to each other by a suitable adhesive layer or mounted in a common frame.

It is known from JP 60205402 A, for example, to connect a glass optical component to a plastic optical component by means of an adhesive layer. It is furthermore known, for example from JP 07056006 A, to apply a colored plastic layer onto a glass optical component.

The bonding of two glass optical components and the application of plastic onto glass generally require cost-intensive reprocessing, for example in the form of fine polishing or edge grinding.

It is furthermore known from DE 43 38 969 C2 to apply complex diffractive structures onto the surface of an optical component by etching. This method, however, requires elaborate process steps and therefore entails high costs.

To a certain extent, bi- or multifunctional components can be produced by corresponding diffractive structures in fibers; for example, suitably doped silica glass (SiO2) (for example Ge-doped) is already used for the production of Bragg gratings as de/multiplexers (wavelength filtering) or sensors in fibers. An inhomogeneous defect distribution, which leads to refractive index changes by changing the absorption coefficient, is in this case generated in the Ge-doped glass by UV irradiation.

It is furthermore known that structures can be generated in glass by irradiating various glasses with suitable high-energy pulses (fs pulses). For example, positive refractive index changes in the range of $10^{-2}$ are generated by the fs scribing of Ge-doped $SiO_2$ glass (K. Hirao et al., J. Non-Cryst. Solids 235, pp. 31-35, 1998). Similar index changes have also been observed in borosilicates, sulfide and lead glasses (Corning WO 01/44871, PCT/US00/20651). By suitably adjusting the pulse energy and scribing rate, it is in this case possible to produce refractive index changes without physical damage to the glass (ablation, micro-cracks).

BRIEF SUMMARY OF THE INVENTION

It is a general object of the invention to more simply and cost-effectively produce optical components or systems having at least two optical elements, preferably at least one diffractive element and a further refractive and/or diffractive element, and preferably to improve the optical properties of such components and systems.

It is also a particular object of the invention to provide a preferably cost-effectively and precisely manufacturable lens, in which cylinder configuration imaging errors or cylinder configuration errors and errors of semiconductor diode laser arrangements, in particular high-power laser diode (HPLD) arrangements can be corrected.

These objects are directly achieved in a very surprisingly simple way by a component and a method for producing such a component of the present disclosure.

Some terms that are applicable throughout the present application will firstly be defined or clarified below.

The term optical element is intended to mean an at least partially transparent body which affects light passing through, for example by a parallel offset in the case of a plane-parallel plate or filter plate, by a converging or diverging effect in the case of a converging or diverging lens, or by distributing the light over particular target areas in angular ranges, irrespective of whether this effect is achieved refractively or diffractively or refractively and diffractively. The optical effect may, in particular, be based on refraction, diffraction and/or phase shifts of wavefronts of light waves.

The term composite optical element, also referred to below as a hybrid element, is intended to mean an optical element which has at least two volume regions that respectively comprise materials, in particular glasses, which differ in at least one physical and/or chemical property.

The transformation temperature Tg refers to the transformation temperature according to ISO 7884-8.

The optical component according to the invention having a diffractive and/or refractive element, which comprises a photosensitive glass and/or a photosensitive glass ceramic, makes it possible to generate structures influencing the light propagation at least in a part of their volume, which can have extremely advantageous properties in many regards. If the structures influencing the light propagation are refractive index differences generated by exposure, then this can provide diffractively acting absorption-free beam shaping elements which, for example, can be used as correcting components in conventional optical systems. If conventional refractive components, for example those used in imaging or illuminating systems, are produced from the photosensitive glass or the photosensitive glass ceramic, it is in this way possible to correct them with a further degree of freedom, i.e. by the diffractive element in the volume of the photosensitive glass or the photosensitive glass ceramic.

Improved correction of an optical system does not therefore require further refractive or diffractive components; rather, the light propagation can be influenced inside an existing component by the refractive index difference inscribed in its volume and corrective beam shaping can be carried out.

Annular diffracting structures are of great interest in this case, since their chromatic imaging errors run oppositely to those which occur in a converging lens made of glasses with normal dispersion, and can therefore make a contribution to the chromatic correction.

If such annular structures are arranged only at the edge of lenses and not in their middle, then this can mitigate sphere configuration imaging errors.

Such beam shaping, moreover, is also particularly preferable for beam geometries which are not cylindrically symmetrical, for example in high-power semiconductor lasers.

For applications in the optical spectrum, the photosensitive glass and/or the photosensitive glass ceramic particularly preferably comprises at least one oxidic glass, which has a transmission band at least in a part of the visible spectral range. Oxidic glasses are generally silicate glasses which contain silicon dioxide $SiO_2$ as the most important oxidic component.

The photosensitive glass and/or the photosensitive glass ceramic may preferably also comprise at least one chalcogenide glass, which has a transmission band at least in a part of the infrared spectral range. Using such glasses which, in contrast to oxide glasses, are based for example on sulfides, selenides or tellurides, the invention also provides optical components with refractive index modulation for IR applications. Owing to the great polarizability of chalcogenide ions, these glasses are usually colored deeply.

In order to generate the structures influencing the light propagation, which in particular comprise refractive index differences, the photosensitive glass and/or the photosensitive glass ceramic is exposed to irradiation with light, in particular by means of a UV laser or an fs laser. In the photosensitive glass or the photosensitive glass ceramic, which particularly preferably comprises at least one photosensitive element such as Cu, Ag, Au, $Ce^{3+}$ for photostructuring, the light irradiation induces chemical processes which lead to the formation of neutral atoms, for example Ag atoms. By subsequent heat treatment, for example by a first heat treatment step at a first temperature, crystallization seeds are generated by agglomeration of the neutral atoms. By further heat treatment, for example by a second heat treatment step at a second temperature above the first temperature, the glass crystallizes on the seeds formed by agglomeration to form a glass ceramic.

In a particularly preferred embodiment, the photosensitive glass and/or the photosensitive glass ceramic is pressed with the action of heat to form a glass component, in which structures influencing the light propagation are produced by means of photostructuring. Photosensitive glasses, or the glass ceramics obtained from these by photo-induced crystallization generally react with great sensitivity to renewed heating such as is required for pressing. Surprisingly, however, pressing, such as blank pressing, can be performed prior to photostructuring in particular using the glasses or glass ceramics according to the invention. It has been found that NAS glasses and glass ceramics are particularly suited to this purpose. Indeed, the transformation temperature of these glasses is precisely within a range allowing pressing. A corresponding optical component having a diffractive and/or refractive element according to this embodiment of the invention accordingly comprises a photosensitive glass and/or a photosensitive glass ceramic with a surface produced by pressing under the action of heat and structures in the glass or glass ceramic influencing the light propagation and produced by exposure. Blank pressing is preferably employed to produce high-grade optical surfaces so that the photosensitive glass component has a blank-pressed outer surface.

The diverging behavior of the generated structures influencing the light propagation can be controlled by the heat treatment process and depends essentially on the crystallite size distribution after the second heat treatment step, and therefore in particular on its duration and the number of seeds present.

The bubble and striation content of the photosensitive glass and/or the photosensitive glass ceramic is essentially determined by the production process, in particular the melting process. By cooling the glass melt in the melting crucible and/or discharging it downward by means of a so-called downpipe, it is possible to achieve good freedom from bubbles and striations.

Conventional fining agents such as $Sb_2O_3$ or $SnO_2$ are preferably omitted in order to avoid Ag reduction by the corresponding polyvalent cations. Furthermore, certain oxidation states of some of these oxides can have a coloring effect on the glass.

Surface roughnesses which are created when generating the structures, and which influence the light propagation, can be eliminated by optical polishing.

The photosensitive glass and/or the photosensitive glass ceramic particularly preferably comprises photosensitive alkali aluminosilicate glasses and/or glass ceramics which are doped preferably with $Ag_2O$ and/or $CeO_2$.

The photosensitive glass and/or the photosensitive glass ceramic contains preferably from 20 to 80%, in particular from 53 to 72%, in particular from 55 to 70% of $SiO_2$ based on weight as a network forming agent.

Aluminum oxide is preferably contained at between 3 and 25, in particular between 4 and 20, in particular between 4 and 14 wt. %. In this way, inter alia, it is possible to adjust the chemical stability of the glass. With higher proportions of $Al_2O_3$, the glass is inclined to crystallization which is not precluded according to the invention, but is merely less preferable.

The $Li_2O$ content is preferably from 0 to 15, in particular from 0 to 10, in particular from 0 to 6 wt. %. If the material is used in crystallized form or is crystallized or semicrystallized after the laser scribing, Li is an essential component of the primary crystalline phases such as high quartz mixed crystal, keatite, virgilite, petalite, eucryptite, spodumene or their mixtures. Furthermore, secondary phases such as quartz, cristobalite or berlinite may also occur.

Even if not all the phases are optically transparent or fully transparent, there are applications in the nonoptical field, for example MEMS or micromechanical applications, which do not necessarily require transparent material.

The glass may furthermore contain from 1 to 25, in particular from 1 to 20, in particular from 1 to 17 wt. % of $Na_2O$. If the material is used in crystallized form or is crystallized or semicrystallized after the laser scribing, Na is an essential component of the primary crystalline phases such as NaF, NaBr, NaCl or mixed forms.

The glass may furthermore contain from 0 to 7, in particular from 0 to 5, in particular from 0 to 4 wt. % of $P_2O_5$, from 0 to 5, in particular from 0 to 3 wt. % of $B_2O_3$, from 0 to 10, in particular from 0 to 6, in particular from 0 to 5 wt. % of $ZrO_2$, from 0 to 5, in particular from 0 to 4, in particular from 0 to 3 wt. % of $TiO_2$, from 0 to 20, in particular from 0 to 18, in particular from 0 to 15 wt. % of $Gd_2O_3$, from 0 to 12, in particular from 0 to 10, in particular from 0 to 8 wt. % of $La_2O_3$, and from 0 to 15, in particular from 0 to 13, in particular from 0 to 10 wt. % of $Ta_2O_5$.

Further components which may be contained are sensitizers and/or activators for photostructuring, such as $Ce_2O_3$, $Er_2O_3$, $Eu_2O_3$ etc., photooxidizable and photoreducible elements such as $Ag^+$, $Cu^{+/2+}$, $Au^+$, $Eu^{2+}$, $Ce^{3+}$, and other suitable elements.

The glass or the glass ceramic preferably contains from 0.01 to 0.4, in particular from 0.02 to 0.2, in particular from 0.03 to 0.1 wt. % of $Ag_2O$, and from 0.01 to 0.4, in particular from 0.02 to 0.06, in particular from 0.02 to 0.04 wt. % of $CeO_2$.

In glasses with a high $CeO_2$ content, in the essential absence of $Ag^+$ ions, structures that can be removed again by a temperature increase to at least 200° C. may be generated by photostructuring. In this way, the invention can provide a rewritable optical component in which different structures can be inscribed for respectively varying application purposes and removed again.

The glass or the glass ceramic may furthermore contain thermal stabilizers and fining agents such as $Sb_2O_3$, for example at from 0 to 1, in particular from 0 to 0.6 wt. %, or $As_2O_3$ at for example from 0 to 2, in particular from 0 to 1 wt. %, etc. Furthermore, the glass or the glass ceramic may also contain halides, preferably F, Br, Cl and/or I.

The glass or the glass ceramic may furthermore preferably contain from 0 to 5, in particular from 0 to 4 wt. % of $K_2O$, from 1 to 10 wt. % of ZnO, from 0 to 5, in particular from 0 to 4 wt. % of MgO, from 0 to 5, in particular from 0 to 4 wt. % of CaO, and from 0 to 10, in particular from 0 to 8, in particular from 0 to 6 wt. % of BaO. Other (not mentioned) compounds of alkali and alkaline earth metals may also be contained.

The photosensitive glass and/or the photosensitive glass ceramic is exposed to laser radiation for structuring, in particular to UV laser radiation or fs IR laser radiation. A refractive index modulation which amounts to at least $10^{-4}$ is preferably achieved by the laser structuring.

It is furthermore within the scope of the invention for the optical component according to the invention to have a diffractive and/or refractive optical element that comprises an optically usable plastic. Suitable plastics are, for example, polymethyl methacrylate, polymethyl methacrylimide, polystyrene, poly(styrene-co-acrylonitrile), polycarbonate, cycloolefin copolymer, cycloolefin polymer, methylpentene copolymer or polyethylene terephthalate.

According to the invention, optical elements that comprise different materials may accordingly be combined to form an optical component. Examples of material combinations are plastic/photosensitive glass/glass ceramic, glass/photosensitive glass/glass ceramic or plastic/glass/photosensitive glass/glass ceramic. Of course, any other desired combinations also lie within the scope of the invention.

A particularly preferred embodiment of an optical component according to the invention comprises an FAC lens (fast axis collimating lens), preferably in the form of a cylinder lens, which advantageously has a refractive optical element preferably comprising a spherical surface, and at least one diffractive element. A first diffractive optical element is particularly preferably defined by the refractive index modulation of the photosensitive glass or the photosensitive glass ceramic. In particular, a volume hologram is formed by the first diffractive optical element.

The refractive optical element particularly preferably comprises an aspherical surface, the first diffractive optical element being defined at least in part by the refractive index modulation of the photosensitive glass or the photosensitive glass ceramic.

At least a second diffractive optical element is particularly preferably arranged on the body of the refractive optical element of the optical component, which is preferably designed as a cylinder lens, or is defined by it. The second diffractive optical element is particularly preferably arranged in a plane lying opposite the refractive surface. The second diffractive element may, for example, be a phase hologram on the surface of the optical component or a Fresnel lens.

If the cylinder lens is designed with a refractive optical element, preferably comprising a planoconvex cylindrical surface, and with a diffractive optical element which is preferably arranged on the plane surface, then it is possible to compensate for optical imaging errors due to a spherical convex side geometry and/or low-index optical materials since the diffractive optical element can generate a kind of precorrection of the phase fronts, which correspond to an essentially exact compensation after having passed through the refractively acting lens part. For example, the following algorithms may be employed in order to determine the required position-dependent phase shift, absorption and/or reflection:

1. Analytical calculation formulae, as described in standard textbooks (for example J. Turunen, F. Wyrowski, "Diffractive Optics", Akademie, 1997)
2. Numerical optimization methods as implemented, for example, in commercial lens design software programs such as Zemax or Code V.

If the diffractive optical element is arranged in a plane lying opposite the cylindrical surface, then this can provide a hybrid diffractive-refractive lens system which allows a very exact spacing of the two lens subsystems. In this case the first and/or second diffractive element, together with the cylindrical surface, preferably defines an aspherical cylinder lens which, in the context of this application, is a cylinder lens that has scarcely any optical imaging errors, in particular no spherical and chromatic aberrations.

In a particularly preferred embodiment, the cylinder lens is a fast axis collimating lens assigned to at least one semiconductor laser. In another configuration according to the invention, the cylinder lens is assigned to a preferably linear array of semiconductor diode lasers, in particular an array of high-power diode lasers.

If the cylinder lens comprises at least one defined curvature in its optical and/or physical longitudinal direction, it is thereby possible to compensate for errors of the diode laser array in a defined way, preferably in relation to a tolerance field. This curvature of a semiconductor laser array, also referred to as a "smile", can in this way be compensated for by suitable holographic techniques in a standard cylinder lens which comprises a photosensitive glass according to the invention and/or a photosensitive glass ceramic according to the invention.

If the cylinder lens comprises a further functional element, it is possible to achieve considerable advantages in this way. A further functional element may generate imaging, for example, preferably far-field imaging which makes it possible to align the cylinder lens, preferably when it is being mounted, relative to a light source and/or an external pattern.

If the further functional element is a diffractive optical element which is suitable for directing light onto a detector as a function of the position of the cylinder lens relative to a light source, then the intensity signal obtained by the detector may be used for adjustment instead of or in addition to the imaging. A four-quadrant detector is in this case preferable as a position resolving optical detector.

It is furthermore preferable for the additional optical element to be a diffractive optical element, by means of which a marking can be imaged and/or read. In this way, it is possible to mark or encode manufacturer information, material properties, tolerance classes, longitudinal bending classes or product numbers.

The further diffractive element may furthermore cost-effectively have a focusing or prefocusing effect as part of a multilens collimating system. The further diffractive element furthermore preferably defines a cylinder lens having a curved optical longitudinal axis.

If the further diffractive element defines a further cylinder lens whose optical longitudinal axis essentially extends transversely to the optical longitudinal axis of the cylinder lens, then independent focusing and/or error compensation can be carried out in two directions, preferably extending perpendicularly to each other. It is in this case preferable for the further diffractive element to have a focusing or prefocusing effect, preferably transversely to the optical longitudinal axis of the cylinder lens, as a slow axis collimating lens or part of a slow axis collimating lens system.

It may be preferable for the diffractive and refractive components to be arranged essentially tilted with respect to the optical longitudinal axis, in order to obtain independent focusing and/or error compensation in a plurality of directions. It is in this case preferable to arrange the individual elements in a segmented fashion, at least one segment being assigned to a laser emitter. The resulting sub-beams improve uniform illumination of the overall aperture and reduce the light reflection from the component surfaces into the laser emitter.

An optical component according to the invention, in particular in the form of a cylinder lens, is accordingly designed so that a further optical element is respectively assigned to a high-power laser diode of a preferably linear high-power laser diode array.

The invention also relates to a lens system which comprises an optical component, in particular a cylinder lens, as described above.

The invention furthermore relates to a set of cylinder lenses respectively having a different curvature in the longitudinal direction of the cylinder lens transversely to its optical axis, for tolerance field equalizing compensation of curvatures of high-power diode laser arrays, and to a semiconductor laser system which comprises in particular a cylinder lens as described above.

The invention also relates to a use of a described optical component for longitudinal mode stabilization in a laser system, preferably in a semiconductor laser system, for transverse mode stabilization in a laser system, preferably in a semiconductor laser system.

The invention furthermore preferably relates to the use of a described optical component in a semiconductor laser system, in particular for mode stabilizing and/or latching the modes of a plurality of lasers, particularly arranged next to one another, in the laser system.

The size of optical image sensors is nowadays defined primarily by the required sensitivity and by the angle dependence of the sensitivity. The invention relates to an optical image sensor having a multiplicity of optical sensor units, comprising an optical component having a multiplicity of diffractive and/or refractive elements which comprise a photosensitive glass and/or a photosensitive glass ceramic, which respectively comprise structures influencing the light propagation at least in a part of their volume, these structures converging light, in particular obliquely incident light, respectively at the position of a sensor unit. In this way, it is possible to achieve an increased sensitivity and a lower angle dependence of the sensitivity of the sensor, and thereby reduce the size.

A first preferred embodiment of an optical display according to the invention comprises a multiplicity of preferably separately drivable image elements, the display comprising an optical component having a multiplicity of diffractive and/or refractive elements which comprise a photosensitive glass and/or a photosensitive glass ceramic, which respectively comprise structures influencing the light propagation at least in a part of their volume, these structures receiving light, in particular light emerging from the respective image element, in the vicinity of the position of the image element and, acting as a diverging structure or diverging lens, delivering it into a larger solid angle range.

Such a display is preferably still brighter and richer in contrast than a conventional display even at an oblique angle. A significant improvement of the optical properties can thereby be achieved, for example in digital cameras, in particular in their backwall display.

A second preferred embodiment of an optical display according to the invention comprises a multiplicity of preferably separately drivable image elements, the display comprising an optical component having a multiplicity of diffractive and/or refractive elements which comprise a photosensitive glass and/or a photosensitive glass ceramic, which respectively comprise structures influencing the light propagation at least in a part of their volume, these structures receiving light, in particular light emerging from the respective image element, in the vicinity of the position of the image element and, acting as a diverging structure or diverging lens, delivering it into a narrower predefined solid angle range.

Such a display offers advantages particularly for certain applications, for example in the banking field in order to prevent viewing from the side. Such a display also makes it possible to provide a brighter and more brilliant electronic viewfinder of a digital camera, when the emission angle of the image elements is adapted to the numerical aperture of the eyepiece.

The invention furthermore relates to an optical imager having a multiplicity of reflecting micromechanical elements comprising an optical component having a multiplicity of diffractive and/or refractive elements which comprise a photosensitive glass and/or a photosensitive glass ceramic, which respectively comprise structures influencing the light propagation at least in a part of their volume, these structures converging light, in particular obliquely incident light, respectively at the position of a micromechanical element.

A particularly preferred embodiment of the invention relates to a wafer level package, which comprises an optical image sensor and/or an optical imager as described above.

Full-surface utilization of the imager is achieved in that the not co-moved dark edge regions between the micromechanical elements are compensated for by the mutually adjacent microlenses.

The object of the invention is furthermore achieved by an optical component, which preferably comprises a composite element, having a first optical element which contains a first photosensitive glass having a transformation temperature Tg1 and structures influencing the light propagation at least in a part of its volume, and a second optical element which contains a second glass having a transformation temperature Tg2, the transformation temperature Tg1 having a higher value than the transformation temperature Tg2 and the second glass being joined together directly with the first glass along a common surface region to form a lasting connection.

Preferably, the glass of the second optical element of the composite optical element at least in a part of the surface region, along which it is joined to the glass of the first optical element, essentially has the negative shape of the first optical element.

The surface of at least one optical element of the composite optical element particularly preferably contains diffractive elements that have the effect of a converging, diverging, spherical or aspherical lens or act in a beam splitting, beam shaping, beam profile modifying, athermal, achromatic way or have another optical effect and/or function.

In a preferred embodiment, the composite optical element comprises an optical element which, at least in a subregion, has a shape whose surface contains diffractive and/or refractive elements that have the effect of a spherical lens.

In another preferred embodiment, the composite optical element comprises an optical element which, at least in a subregion, has a shape whose surface contains diffractive and/or refractive elements that have the effect of an aspherical lens.

The composite optical element preferably comprises at least two glasses having different dispersion properties, the composite element preferably being designed so as to minimize chromatic errors.

The composite optical element particularly preferably furthermore comprises a lens system or a lens sequence, which is suitable for correcting spherical aberrations, astigmatism and/or coma, or contributing to their correction in the overall system.

The composite optical element is particularly preferably designed as an array, and accordingly comprises a multiplicity of optical elements, which are connected in an ordered field to the first optical element, preferably designed as a support element.

The expansion coefficients of photosensitive LAS and NAS glasses are typically in a range of between 8 and 10 ppm/K.

In a preferred configuration, the composite optical element comprises at least two glasses having different thermal expansion coefficients, one of which preferably corresponds essentially to that of a semiconductor wafer, in particular an Si, GaAs or GaN wafer. In this configuration, the optical element is particularly suitable for wafer level packaging.

Further optical elements may furthermore preferably be connected to a composite optical element by means of an adhesion promoting or adhesive layer.

A composite optical element according to the invention may furthermore preferably comprise at least one further diffractive and/or refractive optical element, which comprises a glass ceramic and/or a plastic.

The invention furthermore relates to an optical component, which preferably comprises a composite element as described above having a first optical element, which contains a first photosensitive glass and/or a first photosensitive glass ceramic and structures influencing the light propagation at least in a part of its volume, and a second optical element which comprises a second glass and/or a second glass ceramic, the second glass and/or the second glass ceramic being joined together directly with the first glass and/or the first glass ceramic along a common surface region to form a lasting connection, and this lasting connection being produced by means of bonding, in particular by means of anodic bonding or by means of a low temperature bonding method as defined in PCT/US00/41721, its priority-forming prior applications and the applications which claim of the priority of PCT/US00/41721 or the priority-forming prior applications of PCT/US00/41721.

In order to deliberately counteract chromatic aberrations, the structures of the optical component that influence the propagation of the light influence the light only in a part of the transmission spectrum.

Naturally, the invention also relates to imaging or illuminating optics and imaging systems, which comprise a composite optical element as described above.

In a particularly preferred method according to the invention for producing an optical component, in particular a described optical component, the photosensitive glass and/or the photosensitive glass ceramic is melted under oxidizing conditions and the photosensitive glass and/or the photosensitive glass ceramic has the following composition in wt. % after it is melted:

|  | min | max |
|---|---|---|
| $SiO_2$ | 20 | 80 |
| $Ag_2O$ | 0.01 | 0.4 |
| $CeO_2$ | 0.01 | 0.06 |
| $Sb_2O_3$ | 0 | 1 |
| $B_2O_3$ | 0 | 5 |
| $Al_2O_3$ | 3 | 25 |
| $Li_2O$ | 0 | 15 |
| $Na_2O$ | 1 | 25 |
| $K_2O$ | 0 | 5 |
| ZnO | 1 | 10 |
| MgO | 0 | 5 |
| CaO | 0 | 5 |
| BaO | 0 | 10 |
| $Br_2$ | 0 | 5 |

-continued

|  | min | max |
|---|---|---|
| $F_2$ | 0 | 5 |
| $P_2O_5$ | 0 | 7 |
| $ZrO_2$ | 0 | 10 |
| $As_2O_3$ | 0 | 2 |
| $TiO_2$ | 0 | 5 |
| $Gd_2O_3$ | 0 | 20 |
| $La_2O_3$ | 0 | 12 |
| $Ta_2O_5$ | 0 | 15 |

Particularly preferably, oxygen is passed through the melt according to the method.

Furthermore, the evaporation of volatile substances is particularly preferably avoided or suppressed during the melting of the glass and/or the glass ceramic. This is preferably achieved by means of a fluid-tight melting vessel. This achieves better homogeneity and increased photosensitivity. The Inventors have furthermore surprisingly established that the so-called gutter crucible developed for fluorophosphate glasses is also outstandingly usable for photosensitive glasses and/or glass ceramics oxidizingly melted according to the invention.

The use of a so-called downpipe also leads to better freedom from striations and homogeneity, since downward discharge leads to a gentler outflow and, in particular, does not take place through the F and Br depleted surface layer.

A combination of pot melting and roller quenching is also particularly preferable, since it allows particularly cost-effective production of large quantities.

Particularly suitable melting vessels for melting the glass and/or the glass ceramic comprise, for example, platinum, platinum alloys, quartzal or silica glass. Besides this, other materials such as molybdenum, palladium or their alloys are also usable.

Particle and structure sizes of the melted material have a further influence on the homogeneity of the glass and/or the glass ceramic, and on the photosensitivity. In the method according to the invention, it is therefore preferable when melting the glass and/or the glass ceramic for the addition of $Al_2O_3$ to be carried out with a small particle or structure size, preferably with a particle or structure size which is not greater than that defined by a mesh 80 value, in particular by a mesh 60 value, in particular by a mesh 40 value.

The melting temperatures for melting the glass and/or the glass ceramic preferably lie between 1400 and 1700° C., preferably between 1400 and 1500° C. The melting and the subsequent cooling are particularly preferably carried out in a crucible, particularly in a platinum vessel. A melting vessel which comprises a Pt/Ir alloy is also particularly preferred.

In the method according to the invention for producing an optical component, it is furthermore preferable to carry out the shaping of the optical component on at least a part of its refractively and/or diffractively acting surface by means of hot shaping, preferably pressing, embossing, fine embossing, blank pressing or precise pressing.

The shaping of the optical component on at least a part of its refractively and/or diffractively acting surface may furthermore preferably be carried out by means of material-eroding processing, preferably direct material-eroding grinding, polishing or lapping. Other methods may also be used for the shaping, for example CNC shaping, micromachining methods, laser ablation, RIE, wet chemical etching etc.

It is particularly preferable in the method for the structures influencing the light propagation in a part of the volume of the optical component to be introduced after shaping the optical component and/or joining it to other elements or devices. For example, this offers the advantage of using self-adjusting holographic methods in the finally shaped component.

On the other hand, it may also be preferable in the method according to the invention for the structures influencing the light propagation in a part of the volume of the optical component to be introduced before shaping the optical component. This offers the considerable advantage that standard structures, for example cylinder lenses with Bragg gratings, can be produced as arrays without prior individualization.

The invention furthermore achieves the technical object by a method for producing an optical component having at least a first and a second optical element, wherein the first optical element contains a first glass, the second optical element contains a second glass, and the first glass has a transformation temperature Tg1 different than the transformation temperature Tg2 of the second glass, and at least the glass of the second optical element is heated and brought in contact with the glass of the first optical element.

In the method according to the invention, it is preferable for the transformation temperature Tg1 of the first glass to be higher than the transformation temperature Tg2 of the second glass.

The second glass, at least in the region which is brought in contact with the first glass, or the entire second optical element, is preferably heated to a temperature which is greater than or equal to the transformation temperature Tg2 of the second glass, which makes it possible to deform the second glass.

The second glass, at least in the region which is brought in contact with the first glass, or the entire second optical element, is particularly preferably heated to a temperature at which the viscosity of the second glass at least in this region is less than or equal to a viscosity of about $h<10^{10}$ dPa·s, in particular-less than or equal to a viscosity of about $h<10^9$ dPa·s. With such a viscosity of the second glass, it forms a lasting connection with the first glass which is stable even after cooling. Plastics do not exhibit such a behavior, for example, which is why it is particularly preferable to use glass.

The glass of the first optical element, at least in the region in contact with which the glass of the second optical element is brought, or the entire first optical element, is preferably heated to a temperature which is greater than or equal to the transformation temperature Tg2 of the second glass but lower than the transformation temperature Tg1 of the first glass.

In a particularly preferred embodiment of the method, more than one second optical element, preferably in an ordered field (array), is brought in contact with the first optical element.

Furthermore, at least in the region in contact with which one or more further glasses are brought, an adhesion promoting layer that increases the adhesion capability of the one or more further glasses may preferably be applied on the glass of the first and/or the second optical element.

The first optical element and the second optical element are preferably joined together directly along a common surface region to form a lasting connection, this lasting connection being produced by means of bonding, in particular by means of anodic bonding or by means of a low temperature bonding method as defined in PCT/US00/41721, its priority-forming prior applications and the applications which claim of the priority of PCT/US00/41721 or the priority-forming prior applications of PCT/US00/41721.

BRIEF DESCRIPTION OF THE SEVERAL VIEWS OF THE DRAWINGS

The invention will be described in more detail below with the aid of preferred embodiments and with reference to the appended drawings. Identical reference numerals in the drawings denote identical or similar parts.

DETAILED DESCRIPTION OF THE INVENTION

Figure 1A:
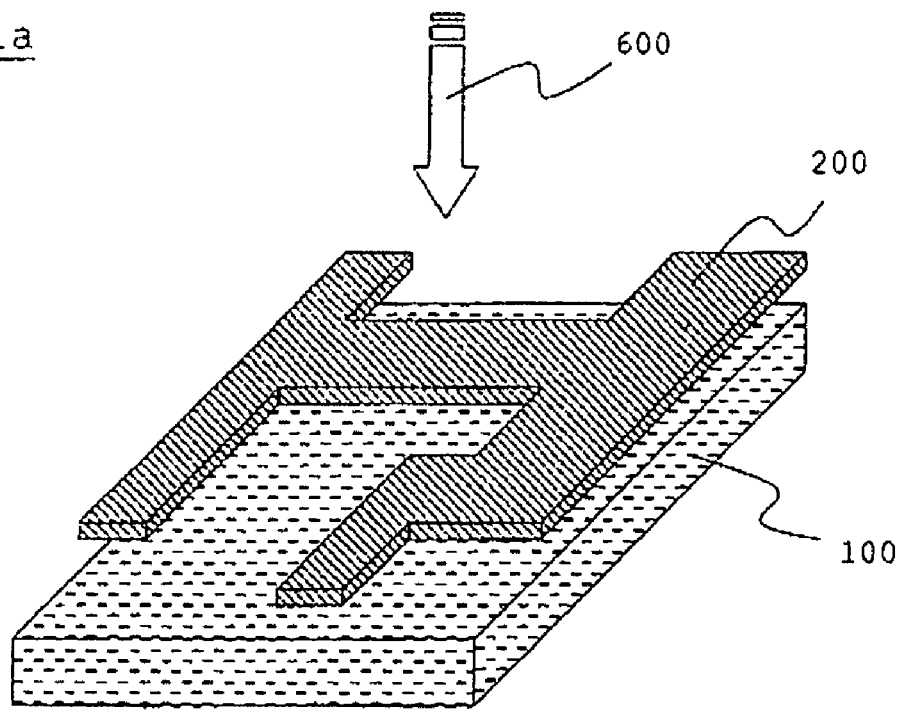
FIG. 1a schematically shows the exposure of a photosensitive glass by means of a mask, FIG. 1b schematically shows a photostructured optical element, FIG. 2a schematically shows the exposure of a photosensitive glass by means of a grating-shaped mask, FIG. 2b schematically shows a photostructured optical element in the form of an optical grating, FIG. 3 schematically shows the process on which a photosensitive glass according to the invention is based, with reference to the example of a sodium aluminosilicate (NAS) glass, FIG. 4 schematically shows the process represented in FIG. 3, with an additional exposure and heat treatment step, FIG. 5 schematically shows the connection of a structured photosensitive glass to a further optical element, FIG. 6 schematically shows an intensity distribution as a function of wavelength for the use of a grating to increase the brilliance of a laser diode, FIG. 7 schematically shows a perspective representation of a preferred embodiment of a cylinder lens, having a refractive optical element and a diffractive optical element, FIG. 8 schematically shows a perspective representation of a preferred embodiment of a cylinder lens, which is arranged on a linear array of high-power semiconductor diode lasers, FIG. 9 schematically shows a perspective representation of a preferred embodiment of a cylinder lens doublet arrangement, which can be used both as a fast axis collimating arrangement and as a slow axis collimating arrangement, FIG. 10 schematically shows a composite optical element having a planoconvex lens, FIG. 11 schematically shows a composite optical element having a planoconcave lens, FIG. 12 schematically shows a composite optical element having an aspherical lens, FIG. 13 schematically shows a composite optical element having a Fresnel lens, FIG. 14 schematically shows a composite optical element having a planoconvex lens and a Fresnel lens, FIG. 15 schematically shows a composite optical element having a planoconvex lens on each side, FIG. 16 schematically shows a composite optical element having an aspherical lens on each side, FIG. 17 schematically shows a composite optical element having a Fresnel lens on each side, FIG. 18 schematically shows a plan view of an individualized Fresnel microlens, FIG. 19 schematically shows a perspective view of an individualized Fresnel microlens, FIG. 20 schematically shows a plan view of a microlens, which is arranged on a substrate with annular photostructuring, FIG. 21 schematically shows a perspective view of a microlens, which is arranged on a substrate with annular photostructuring, FIG. 22 schematically shows a plan view of a microlens array having microlenses arranged in rows, FIG. 23 schematically shows a plan view of a microlens array having microlenses arranged offset, FIG. 24 schematically shows a plan view of a microlens array having hexagonal microlenses, FIG. 25 schematically shows a plan view of a microlens array having Fresnel microlenses, FIG. 26a schematically shows an optical image sensor, FIG. 26b schematically shows an optical image sensor.

In the following detailed description of the individual embodiments preferred according to the invention, it should firstly be established that the appended drawings are merely explanatory in nature and do not necessarily give true-to-scale representations of actual embodiments. It will also be based on the clarifying explanations of the next sections.

It should firstly be pointed out that the term "optical longitudinal axis of a cylinder lens" used in the present description and in the claims is not restricted to its physical-geometrical dimensions.

For conventional, purely refractive cylinder lenses or cylinder lens systems, this term $L_r$ is intended to mean the axis which extends in the principal optical plane of the cylinder lens, parallel to the spatial-physical longitudinal axis of this lens, and intersects a principal ray path which travels essentially unrefracted through the cylinder lens, i.e. it intersects a focal-point or focus ray which passes through the middle of the cylinder lens.

In a purely diffractive cylinder lens, there is also such a longitudinal axis $L_d$ which extends essentially parallel to a focal-point line of this cylinder lens, and likewise extends in the principal plane of this diffractive lens.

A possible determination of the lateral position $L_{d2}$ of $L_d$, essentially perpendicularly to the propagation direction of a parallel ray bundle or a plane wavefront can be carried out by determining the position of the symmetry axis of the diffraction pattern and assigning this lateral position of the symmetry axis to the optical longitudinal axis of the diffractive cylinder lens. Translated into geometrical optics, the lateral position $L_{d2}$ of the optical longitudinal axis $L_d$ of the diffractive lens is given, as for the refractive lens, as the intersection point of the optical longitudinal axis with a principal optical ray H.

The definition of a photosensitive glass or a photosensitive glass ceramic, as used in the description and in the claims, also covers the glass which is no longer sensitive after development or heat treatment, and correspondingly also a photosensitive glass ceramic, especially when such glasses and/or glass ceramics exhibit a beam shaping effect in optical components.

It should be established that a plane surface also falls under the definition of a refractive element in the context of the invention, especially when rays incident or emerging obliquely at this surface are subject to an intended, and preferably predefined, change in the propagation direction due to the refractive index difference.

The invention relates to photosensitive glasses, in particular to aluminosilicate glasses containing alkali metals, and particularly preferably to sodium aluminosilicate glasses (NAS glasses) for the inscribing of structures, for example waveguides or gratings, by means of laser light and pressing the photostructured glasses to form lenses.

Photosensitive glasses are generally used in order, with the aid of laser light or UV lamps and suitable masks, to inscribe structures that are distinguished by an increased or reduced refractive index in the glass. As a rule, these structures are not thermally stable in the case of many photosensitive glasses, since the index change is usually based on the formation of thermally annealable defects.

In the case of lithium and sodium aluminosilicate glasses (LAS, NAS glasses), the index change can be stabilized by subsequent heat treatment since the original lattice consisting of metallic silver or extremely small Ag clusters and oxidized Ce(III) (=Ce(IV)) is replaced by a lattice of extremely small NaHal or lithium disilicate crystals or lithium metasilicate crystals with high thermal stability. These glasses can therefore be used particularly preferably for the production of optical components according to the invention.

Besides UV lasers, all photosensitive glasses can also be scribed with fs lasers, in particular fs IR lasers. The advantage in this case is the possibility of inscribing structures directly into the volume, while, owing to the laser light absorption which takes place, UV processes are always concentrated onto the surface and onto a penetration depth dependent on the absorption coefficient. On the other hand, UV processes generally offer the advantage of higher inscribing rates.

Figure 1B:
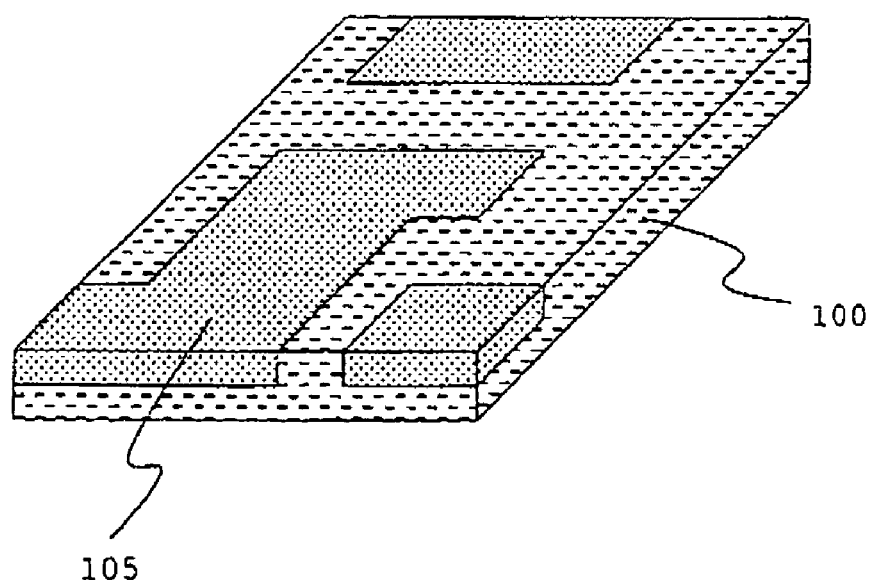

FIG. 1a represents by way of example the laser irradiation 600 of a photosensitive glass 100 by means of a mask 200. The subsequent heat treatment step for thermal stabilization of the refractive index change is not represented. FIG. 1b shows the photosensitive glass 100 after the photostructuring with regions 105 correspondingly changed in respect of their refractive index.

Figure 2A:
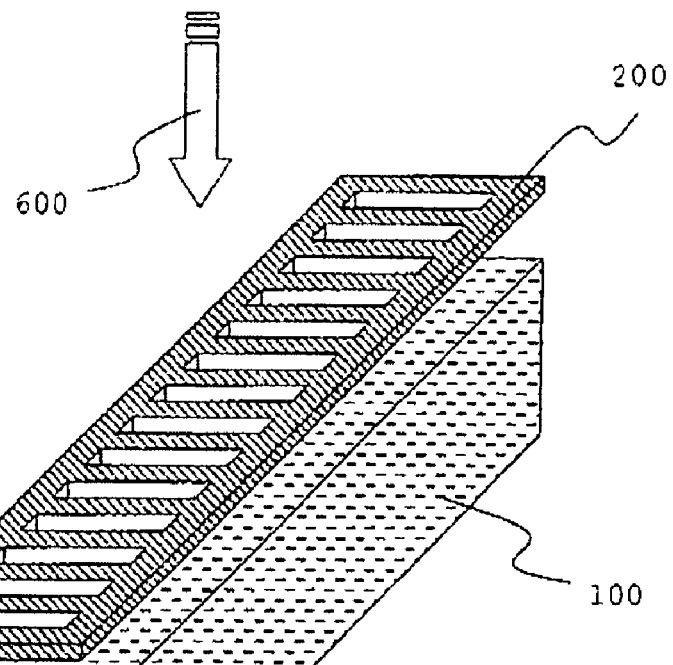
Figure 2B:
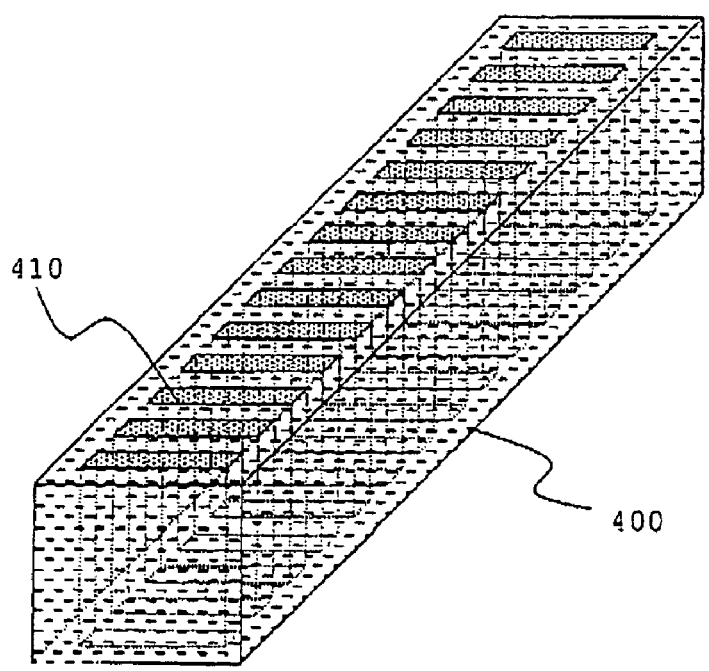

FIGS. 2a and 2b show the process represented in FIGS. 1a and 1b with reference to the example of photostructuring an optical element 400, which comprises a structured pattern 410 in the form of an optical grating.

Figure 3:
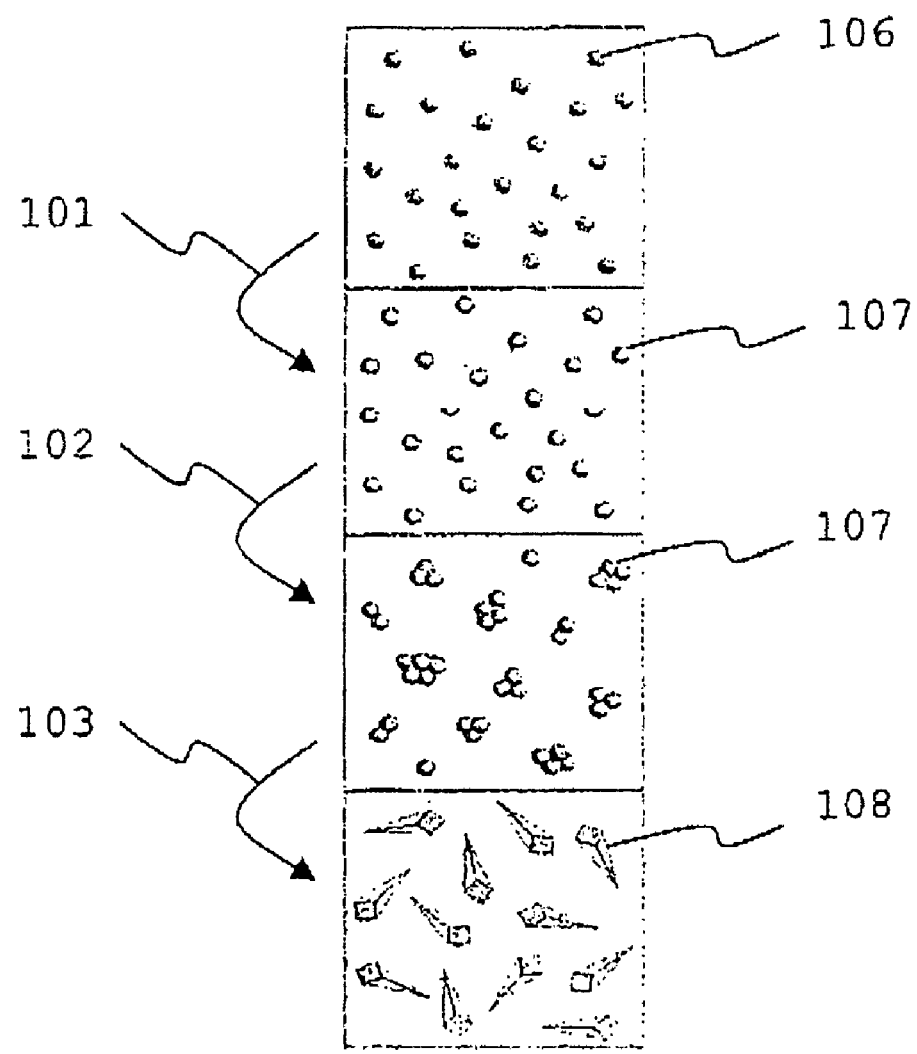

FIG. 3 represents the process of photostructuring with reference to the example of a photosensitive NAS glass according to the invention. In a first step 101, by applying laser radiation, photoreduction of $Ag^+$ ions 106 contained in the glass is carried out by photooxidation of Ce(III) to Ce(IV), with neutral $Ag^0$ atoms 107 being formed:

$$Ce^{3+} \rightarrow e^- + Ce^{4+}$$

$$Ag^+ + e^- \rightarrow (Ag^+)^- \rightarrow Ag^0$$

In the second step 102, silver clusters are formed by heat treatment at a first temperature by diffusion of the $Ag^0$ atoms 107:

$$Ag^0 \rightarrow n(Ag^0)$$

In a third step 103, in which the heat treatment is continued at a higher temperature, NaF microcrystals 108 are formed on the clusters in this exemplary embodiment:

$$n(Ag^0) \rightarrow n(Ag^0)NaF$$

In the presence of Br, the formation of NaBr also takes place. The photosensitivity can also be achieved by other ions, for example $Cu^+$ or $Au^+$. Raising the concentration of the ions leads to increased nucleation. Thermosensitizers such as SnO and $Sb_2O_3$ assist the nucleation. Optical sensitizers such as cerium oxide assist the photoreduction by UV-induced release of an electron. Chemical stabilizers, for example ZnO, may furthermore preferably be used.

Figure 4:
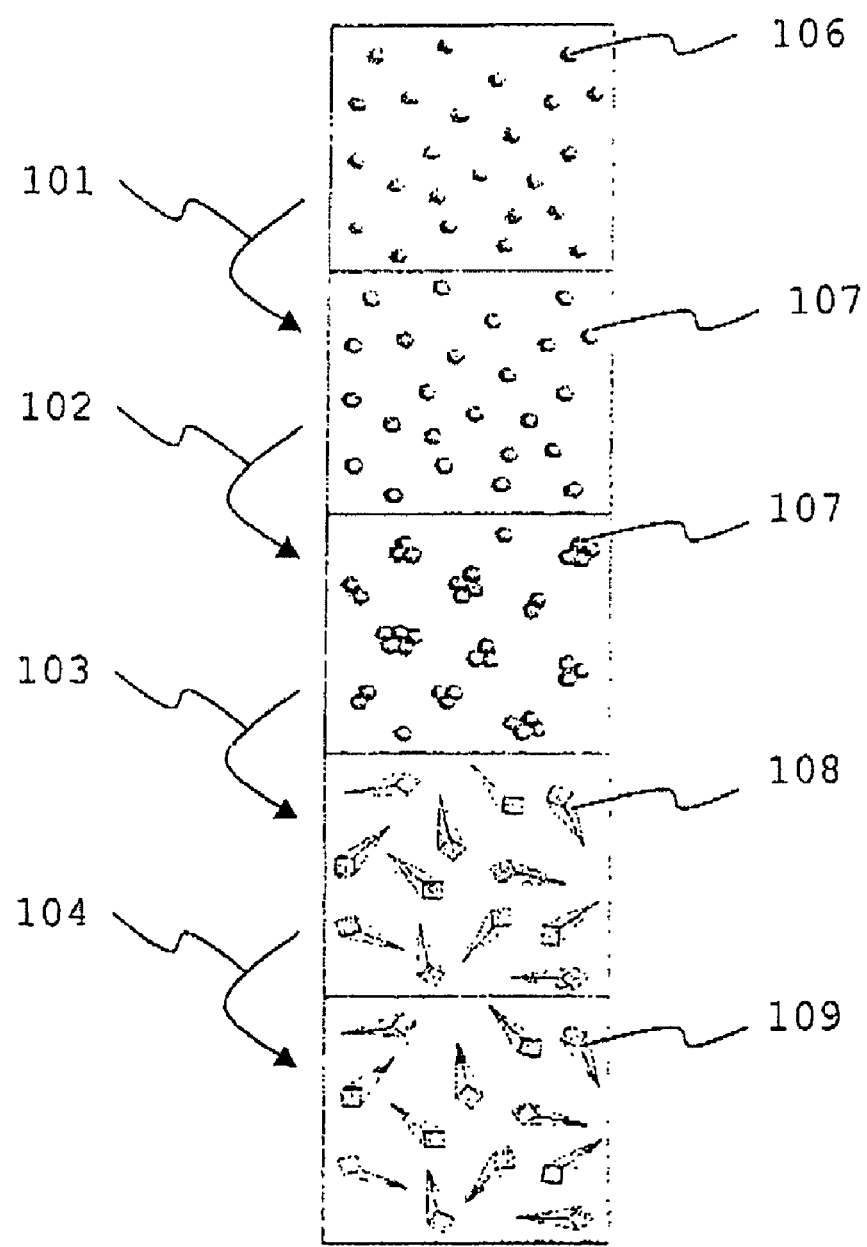

An additional step 104 represented in FIG. 4, which comprises further laser irradiation and another subsequent heat treatment, achieves further induced reduction of silver and thermal deposition of metallic silver on NaF crystals or NaFBr mixed crystals. This additionally leads to the refractive index modulation and to the formation of colors in the photosensitive glass, i.e. to a frequency-dependent transmission band. According to current theoretical ideas, the color is due to the different elliptical shape of the Ag peaks, which leads to splitting of the plasmon band. This lies at about 415 nm and is responsible for the yellow coloration of Ag glasses. Since the second band is shifted further into the visible range according to the shape of the ellipse, different colors are produced. The shape of the ellipse, and therefore the coloration, can be controlled via the photostructuring process.

Only one heat treatment step is employed for the production of lattice structures as represented in FIG. 2b, which leads to the formation of extremely small clusters and to the formation of extremely fine NaF crystals.

By experiments for a photosensitive NAS glass according to the invention, the Inventors could already detect index changes of $5*10^{-4}$ when using an fs laser and $1.5*10^{-3}$ when using a UV laser.

NAS and LAS glasses according to the invention can be produced by standard melting methods, although raw material purity and accurate compliance with the melting conditions must be ensured to a high degree.

The precise composition of the starting materials used for the melting process is also of great importance for the inventive use of the photosensitive glasses. A series of examples of preferred compositions of the starting materials will therefore be given below:

Example 1

| | wt. % |
|---|---|
| $SiO_2$ | 60 |
| $Ag_2O$ | <1 |
| $CeO_2$ | <1 |
| $Al_2O_3$ | 6 |
| $Na_2O$ | 16 |
| $K_2O$ | 1 |
| ZnO | 6 |
| BaO | 6 |
| $Br_2$ | 2 |
| $F_2$ | 2 |

Example 2

| | wt. % |
|---|---|
| $SiO_2$ | 62 |
| $Ag_2O$ | <1 |
| $CeO_2$ | <1 |
| $Al_2O_3$ | 6 |
| $Na_2O$ | 17 |
| $K_2O$ | 1 |
| ZnO | 6 |
| BaO | 3 |
| $Br_2$ | 3 |
| $F_2$ | 2 |

Example 3

| | wt. % |
|---|---|
| $SiO_2$ | 61 |
| $Ag_2O$ | <1 |
| $CeO_2$ | <1 |
| $Al_2O_3$ | 6 |
| $Na_2O$ | 17 |
| $K_2O$ | 1 |
| ZnO | 6 |
| $Zr_2O_3$ | 5 |
| $Br_2$ | 2 |
| $F_2$ | 2 |

Example 4

|  | wt. % |
|---|---|
| $SiO_2$ | 62 |
| $Ag_2O$ | <1 |
| $CeO_2$ | <1 |
| $Al_2O_3$ | 6 |
| $Na_2O$ | 17 |
| $K_2O$ | 2 |
| $ZnO$ | 6 |
| $Zr_2O_3$ | 2 |
| $Br_2$ | 3 |
| $F_2$ | 2 |

Example 5

|  | wt. % |
|---|---|
| $SiO_2$ | 60 |
| $Ag_2O$ | <1 |
| $CeO_2$ | <1 |
| $Al_2O_3$ | 6 |
| $Na_2O$ | 16 |
| $K_2O$ | 1 |
| $ZnO$ | 6 |
| $La_2O_3$ | 7 |
| $Br_2$ | 2 |
| $F_2$ | 2 |

Example 6

|  | wt. % |
|---|---|
| $SiO_2$ | 62 |
| $Ag_2O$ | <1 |
| $CeO_2$ | <1 |
| $Al_2O_3$ | 6 |
| $Na_2O$ | 17 |
| $K_2O$ | 1 |
| $ZnO$ | 6 |
| $La_2O_3$ | 3 |
| $Br_2$ | 2 |
| $F_2$ | 2 |

Example 7

|  | wt. % |
|---|---|
| $SiO_2$ | 56 |
| $Ag_2O$ | <1 |
| $CeO_2$ | <1 |
| $Al_2O_3$ | 5 |
| $Na_2O$ | 15 |
| $K_2O$ | 1 |
| $ZnO$ | 5 |
| $Gd_2O_3$ | 13 |
| $Br_2$ | 2 |
| $F_2$ | 2 |

Example 8

|  | wt. % |
|---|---|
| $SiO_2$ | 60 |
| $Ag_2O$ | <1 |
| $CeO_2$ | <1 |
| $Al_2O_3$ | 6 |
| $Na_2O$ | 16 |
| $K_2O$ | 1 |
| $ZnO$ | 6 |
| $Gd_2O_3$ | 6 |
| $Br_2$ | 2 |
| $F_2$ | 2 |

Example 9

|  | wt. % |
|---|---|
| $SiO_2$ | 58 |
| $Ag_2O$ | <1 |
| $CeO_2$ | <1 |
| $Al_2O_3$ | 6 |
| $Na_2O$ | 15 |
| $K_2O$ | 1 |
| $ZnO$ | 6 |
| $Ta_2O_3$ | 10 |
| $Br_2$ | 2 |
| $F_2$ | 2 |

Example 10

|  | wt. % |
|---|---|
| $SiO_2$ | 61 |
| $Ag_2O$ | <1 |
| $CeO_2$ | <1 |
| $Al_2O_3$ | 6 |
| $Na_2O$ | 16 |
| $K_2O$ | 1 |
| $ZnO$ | 6 |
| $Ta_2O_3$ | 5 |
| $Br_2$ | 2 |
| $F_2$ | 2 |

Example 11

|  | wt. % |
|---|---|
| $SiO_2$ | 65 |
| $Ag_2O$ | <1 |
| $CeO_2$ | <1 |
| $Al_2O_3$ | 6 |
| $Na_2O$ | 16 |
| $K_2O$ | 2 |
| $ZnO$ | 6 |
| $Br_2$ | 3 |
| $F_2$ | 2 |

The bulk glass obtained after melting is preferably cut into small disks and polished before photostructuring, in order to ensure the optical quality.

Figure 5:
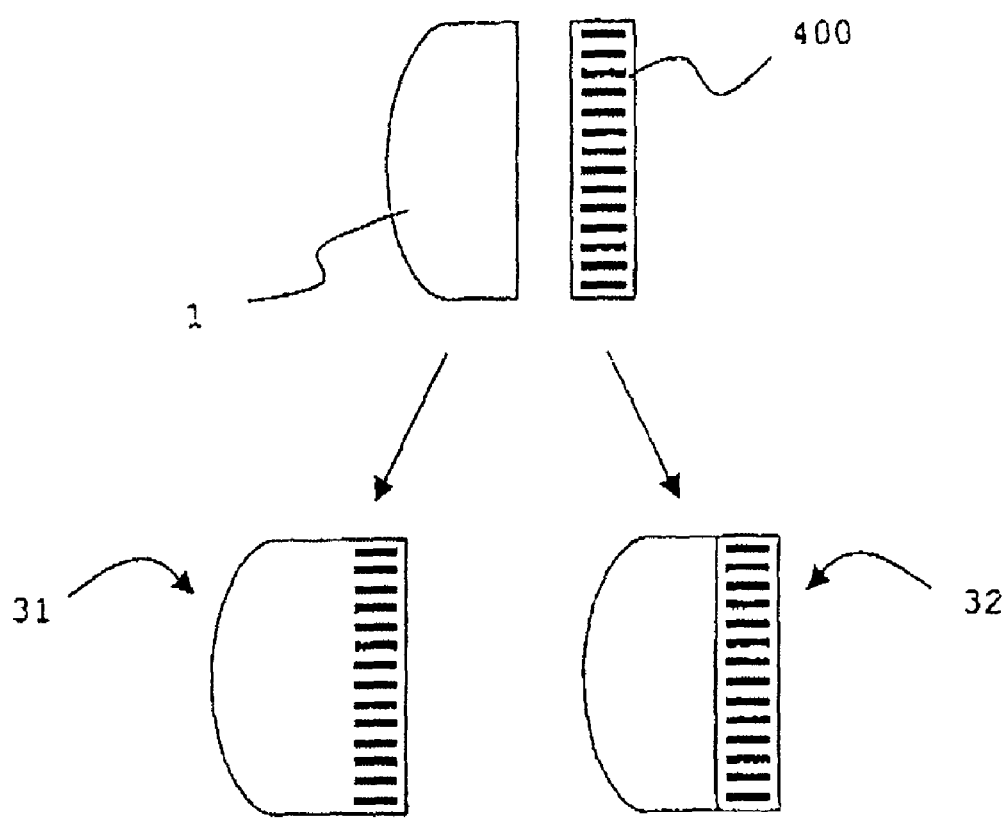

FIG. 5 shows a cylinder lens 1 and an optical element 400, produced by photostructuring, which comprises an optical grating. These two optical elements may be joined together according to the invention by various bonding methods.

For the case in which the two optical elements have different transformation temperatures, it is possible to produce a composite element 31 by heating at least one element to a temperature above its own transformation temperature and below the transformation temperature of the other optical element, and then pressing the two elements together. This produces a permanent adhesive connection between the two optical elements, and therefore a single composite element.

Alternatively, a composite element 32 may also be produced by a low temperature bonding (LTB) method. It is likewise within the scope of the invention to use other bonding processes, for example anodic bonding.

The application field of optical components which comprise a photostructured glass and/or a photostructured glass ceramic is extensive and comprises, for example, waveguides, splitters, combiners, microlenses, Bragg or holographic gratings and MOEMS.

In particular, the invention also allows the production of preferably diffractive elements with high aspect ratios in conjunction with a high |Än|. The integration level of microoptical components, for example sensors, can furthermore be increased significantly. Combinations, for example wavelength-selective filters with arbitrary lens shapes producible by pressing, are also made possible.

WDM filters for wavelength selection, in order to achieve controlled transmission or reflection of particular wavelengths or wavelength ranges, are another field of use.

Controlled back-reflection by means of a diffractive element in the form of a grating can also be used to increase the light power and to stabilize the emission wavelength of a high-power laser diode (HPLD). To this end, a part of the target wavelength is deliberately reflected back into the resonator.

Figure 6:
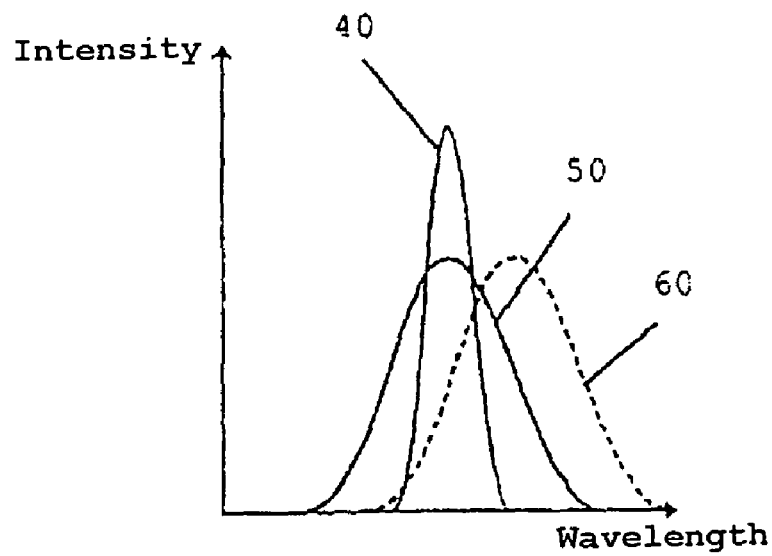

By reflecting back a part of the laser output in the range of a few percent, which corresponds to the target wavelength, into the resonator, the stimulated emission is amplified precisely at this wavelength and therefore the bandwidth of the laser spectrum is reduced and the power of the diode is increased for the target wavelength. FIG. 6 represents a comparison between the laser output 40 with a grating and the laser output 50 without a grating.

The thermal intensity drift 60 of the wavelength can furthermore be avoided by such a diffractive element, since emission of the target wavelength is still favored despite heating of the laser diode.

The inventive combination of a photostructured optical element and a lens can provide an optical component with significant size reduction and reduced installation time due to reduced adjustment outlay.

Figure 7:
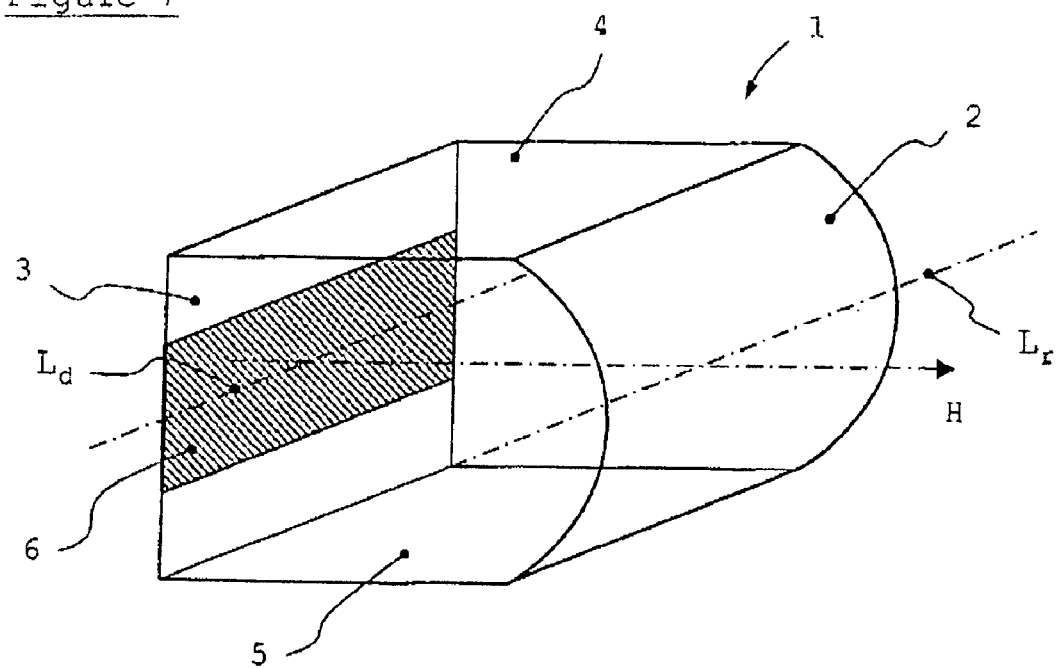

Reference will subsequently be made to FIG. 7, which represents a preferred embodiment of a cylinder lens according to the invention provided overall with the reference numeral 1.

The cylinder lens 1 comprises a spherical or parabolic quasi-cylindrical surface 2 approximating the cylinder shape, and an essentially plane surface 3 which essentially extends perpendicularly to the upper and lower, preferably plane surfaces 4 and 5.

The cylinder lens may consist of quartz glass and all customary inorganic optical glass types, and of optically usable plastics such as: polymethyl methacrylate, polymethyl methacrylimide, polystyrene, poly(styrene-co-acrylonitrile), polycarbonate (including the variants stable at high temperatures), cycloolefin copolymer, cycloolefin polymer, methylpentene copolymer, polyethylene terephthalate.

The material of the cylinder lens may be designed to be highly transparent or semitransparent and, besides glass or plastic, may also consist of a semiconductor material such as germanium, CaF, GaP, ZnSe or silicon for beam and/or wavefront shaping in the infrared range, as is preferred for $CO_2$ material processing lasers. The known material processing methods, for example grinding and lithographic surface processing, are available for this purpose.

A diffractive optical element 6, which may be formed in the plane surface 3 or applied onto it, is arranged on the plane surface 3.

Such a method is particularly preferable when the diffractive optical element 6 constitutes a diffractive cylinder lens which lies in the optical longitudinal direction, a direction which essentially extends parallel to the line Ld represented in FIG. 1 and essentially in the same plane as the principal optical ray H, which passes essentially unrefracted and undiffracted through the cylinder lens 1.

The optical longitudinal axis $L_d$ and the optical longitudinal axis $L_r$ of the refractive element 2 preferably lie in the same plane as the principal optical ray H.

The diffractive optical element 6 is preferably produced by photostructuring, the intended local phase shift of a wavefront arrangement propagating in the direction of the principal ray H being effected by the refractive index modulation.

Figure 8:
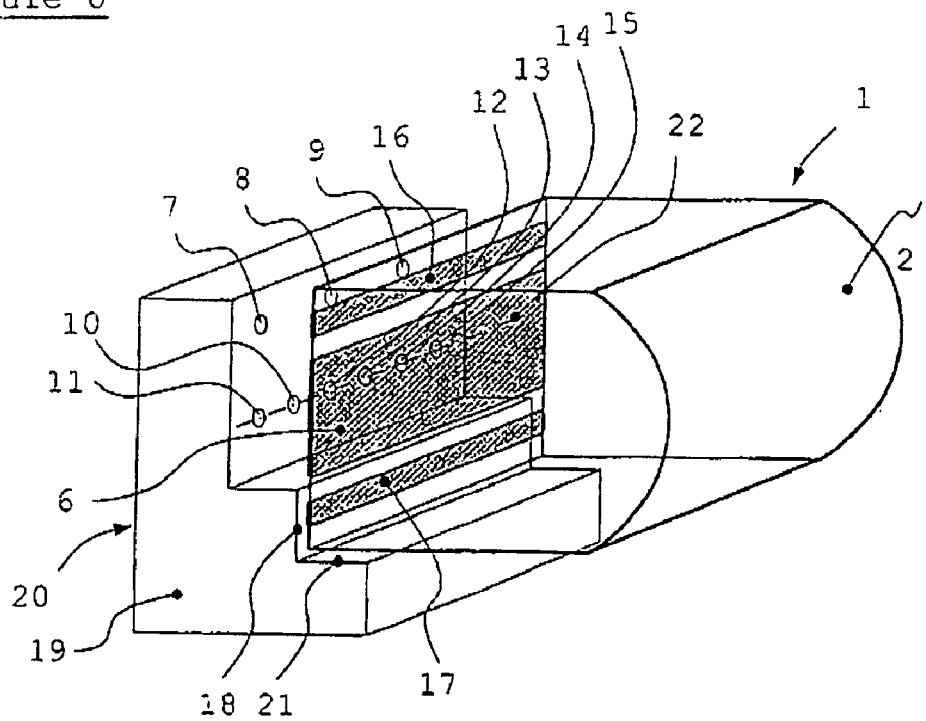

In a particularly preferred embodiment, for example for use as a fast axis collimating lens of a semiconductor diode high-power laser, as represented by way of example in FIG. 8 with the reference numerals 10 to 15, the diffractive element 6 together with the refractive element 2, in particular with its spherical surface, defines an aspherical cylinder lens.

The term aspherical cylinder lens in the present description refers in the adapted sense, similarly as in the case of rotationally symmetric aspheres, to a lens arrangement which is capable of correcting or at least measurably reducing aberrations.

Owing to the small spectral width of the light from the diode lasers 10 to 15, the diffractive element 6 in the preferred embodiment according to the invention corrects optical imaging errors such that off-centered regions of the cylinder lens also have a correctly imaging or beam/wavefront shaping effect, i.e. even off-centered ray paths parallel to the optical axis are essentially combined in a single focal line.

In another configuration of the invention, chromatic errors can furthermore be corrected by superposed diffraction patterns inside the diffractive optical element 6.

Functional elements 16 and 17 are additionally provided in the embodiment represented. The function element 16 and the functional element 17 are preferably arranged on the plane surface 3, although they may also be formed on the upper surface 4 or the lower surface 5, and preferably in an edge region, of the cylindrical surface 2.

The functional elements 16 and 17 are preferably suitable for directing a part of the light, for example from one of the high-power diode lasers 10 to 15, onto one or more of the detectors 7, 8, 9.

Scattered radiation from the respective laser 10 to 15 is preferably used in this case, in order to provide a criterion for correct positioning of the cylinder lens 1 relative to other optical elements, or relative to the high-power diode lasers 10 to 15 themselves, by means of a sharply focused light point or another suitable pattern.

Other preferred patterns may be strip- or grid-shaped interference patterns or Moiré structures, preferably having a non-constant grating period.

Intensity variations can in this way be established by the optical detectors 7, 8, 9 and assigned to correct positioning of the cylinder lens 1. When point patterns are used, the detectors 7, 8, 9 may be multi-quadrant detectors which deliver spatially resolved position data.

The functional element 17 may furthermore preferably contain information, either directly or in an encrypted form. This information may indicate the current data about the cylinder lens, for example actual focal length, effective refracting powers of the optical elements 2, 6 or radii of curvature of the optical longitudinal axes $L_r$, $L_d$, so as to make it possible to call up exact information for further use of the optical system.

The functional element 17 may furthermore contain holographic information which pictorially provides relevant information by back-reflection in a defined image plane.

In an even further preferred embodiment, the further functional element 17 may contain geometrical-spatial structures, for example in the form of superposed Moiré structures together with position information, which is arranged on the surface 18 of the support body 19 of the high-power diode laser array denoted overall by 20.

In addition or as an alternative, the cylinder lens 1 may also bear on the step surface 21, so as to use the mechanical fabrication precision of the support body 19 for lateral adjustment.

It is furthermore within the scope of the invention to couple a part of the light from a semiconductor laser back into the laser in order to increase the brilliance.

Owing to fabrication technology and because of thermal stresses during operation of the high-power array 20, it may happen that the lasers 10 to 15 are not arranged on a straight line, as indicated for example by the dot-and-dash line 22, but instead this line 22 passing through the center of the exit surface of the lasers 10 to 15 has a curvature.

In order to compensate for this curvature, the diffractive element 6 and/or the refractive element 2 may likewise have a curved optical longitudinal axis $L_d$, $L_r$.

Particularly preferably, tolerance field equalizing compensation may be carried out with the diffractive optical element 6. In this case, from a set of cylinder lenses 1 having typical radii of curvature of the optical longitudinal axis $L_d$ and/or $L_r$, a cylinder lens 1 which comes closest with a corresponding curvature may be assigned to a curved laser mid-line 22 so that this curvature is compensated for or at least mitigated in predefined tolerance classes.

Figure 9:
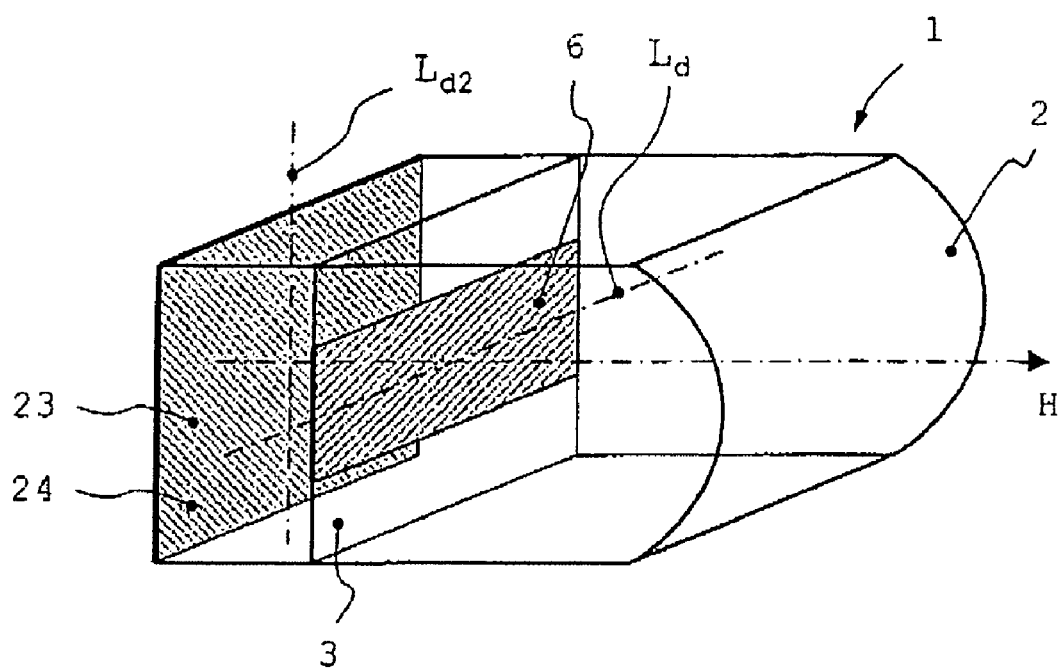

Reference will subsequently be made to FIG. 9, which shows a multilens cylinder lens arrangement 1 in which there is a further diffractive element 23 in addition to the refractive optical element 2 and the diffractive optical element 6.

Merely by way of example, this element 23 is formed on a surface 24 which extends at a distance from and parallel to the surface 3.

The further diffractive element 23 may likewise be arranged on the cylindrical surface of the diffractive element 2 or in an obliquely lying plane 24.

In a particularly preferred embodiment, significant production simplifications can be achieved by means of the further diffractive element 23.

If, for example, the diffractive optical element 23 is designed so that only structures parallel to its optical longitudinal direction $L_d$ are defined, then the further diffractive optical element 23 may for example contain structures which are essentially symmetrical with respect to a second optical longitudinal direction $L_{d2}$, which preferably extend in a plane of the surface 24 perpendicular to the optical longitudinal direction $L_d$.

With the further diffractive optical element 23, it is in this way possible to provide a cylinder lens having an optical longitudinal direction Ld2 perpendicular to the optical longitudinal direction Ld, which for example leads to slow axis collimation or precollimation. With this arrangement, corresponding focusing or prefocusing can already be carried out very close to the light exit surface of the respective lasers 10 to 15, and higher absorption due to longer light propagation paths in the material of the cylinder lens 1 can be avoided.

A further optical element may furthermore be assigned to each laser diode 10 to 15 in a spatially resolved way by the further optical element 23, for example in order to couple light back onto one or more of the optical detectors 7, 8, 9 in the way described above.

In another configuration according to the invention, the diffractive optical element 23 may additionally or alternatively be used to acylindrically correct cylinder configuration errors which, for example, do not occur parallel to the optical longitudinal axis $L_{d2}$ until in a subsequent imaging system.

Independent compensation for these cylinder configuration errors in at least two perpendicular directions parallel to $L_d$ and $L_{d2}$ allows greater degrees of freedom for the correction.

The further diffractive element 23 may also act as a prism in order to generate or compensate for a tilted ray path, for example in order to direct the light from one or more of the lasers 10 to 15 more strongly in a direction parallel or antiparallel to the optical longitudinal axis $L_d$. The disadvantageous step discontinuities between the individual prisms, as known from the prior art, do not occur in this case.

The diffractive optical elements 6, 16, 17, 23 described above may be produced as binary, i.e. digital phase shifting and/or blazed phase shifting and/or absorbing and/or reflecting patterns by photostructuring in a photosensitive glass or a photosensitive glass ceramic.

FIGS. 10 to 13 show examples of a composite optical component produced according to the invention, which is designed as a hybrid lens and respectively comprises a photostructured glass substrate 100, the photosensitive glass of which has a first transformation temperature Tg1. A second optical element, which comprises a second glass with a transformation temperature Tg2 such that Tg2<Tg1, is respectively pressed together with the glass substrate while heating. The glass of the second optical element has been heated before or during the pressing to a temperature at which it has a viscosity of less than $10^{10}$ dPa·s, in particular less than $10^9$ dPa·s, and has therefore formed a lasting connection with the glass of the substrate.

Figure 10:
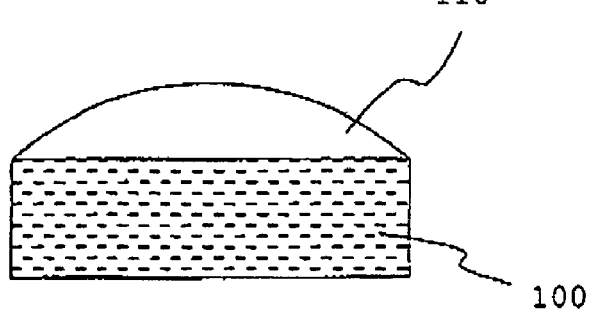
Figure 11:
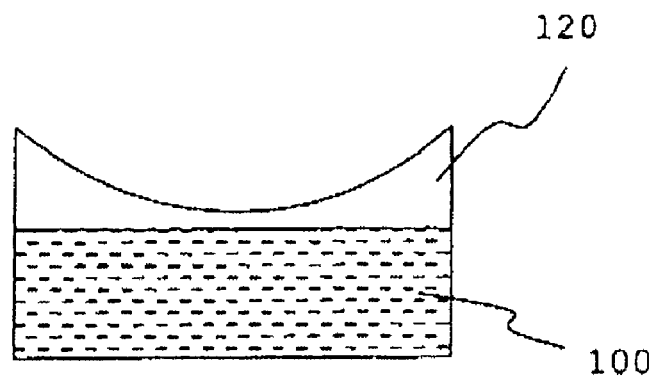
Figure 12:
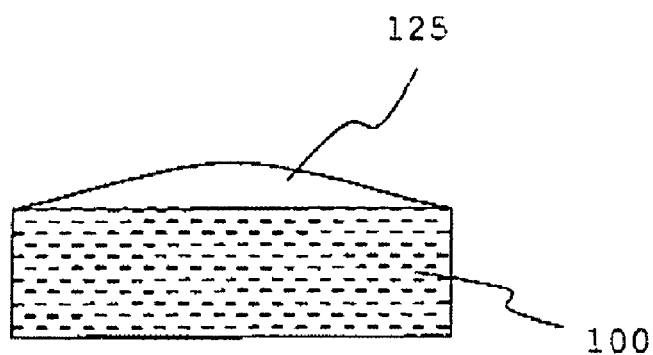

In the hybrid lens shown in FIG. 10, the second optical element is designed as a planoconvex lens 110. The hybrid lenses of FIGS. 11, 12 and 13 each comprise a second optical element designed respectively as a planoconcave lens 120, an aspherical lens 125 and a Fresnel lens 160.

Figure 14:
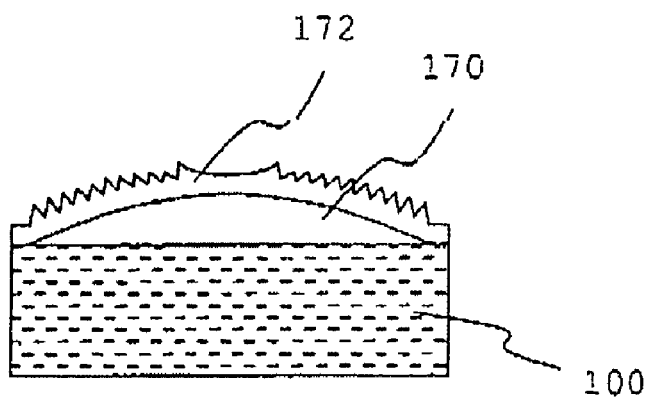

FIG. 14 shows a composite optical element having a first optical element in the form of a substrate 100 photostructured according to the invention, and a second optical element in the form of a planoconvex lens 170, together with which a third optical element 172 that comprises a third glass having a transformation temperature Tg3 such that Tg3<Tg2 has been pressed. The glass of the third optical element 172 has been heated before or during the pressing to a temperature at which it has a viscosity of less than $10^{10}$ dPa·s, in particular less than $10^9$ dPa·s, and has therefore formed a lasting connection with the glass of the second optical element 170. In this exemplary embodiment, the third optical element 172 has the form of a Fresnel lens.

Figure 15:
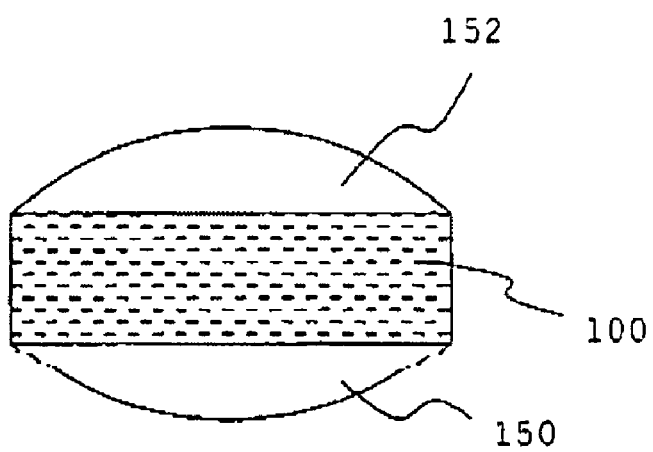
Figure 16:
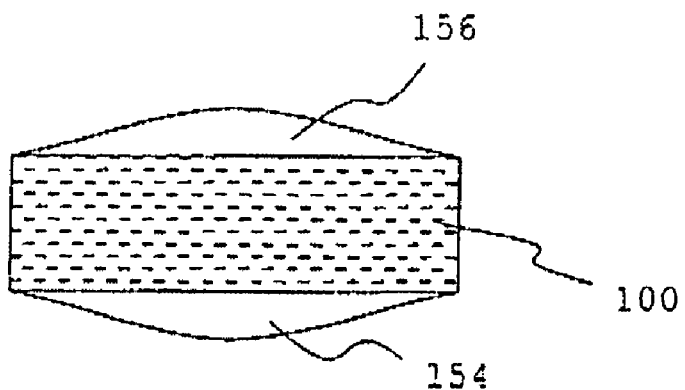
Figure 17:
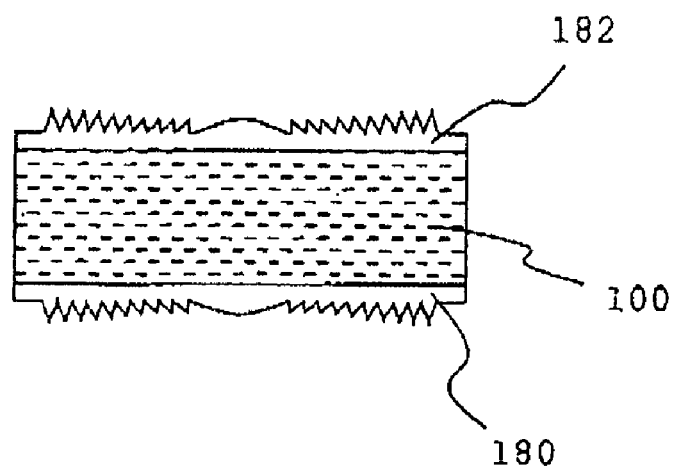

FIGS. 15 to 17 respectively show a composite optical element in which a plane-parallel glass substrate 100, which contains a glass having a transformation temperature Tg1 and which is provided with suitable photostructuring, is pressed together on each side respectively with an optical element that contains a second glass having a transformation temperature Tg2, with Tg2 again having a lower value than Tg1. The pressing may in this case preferably be carried out on both sides in a single working step by using suitable pressing tools.

In the embodiment represented in FIG. 15, the optical elements 150 and 152 pressed together on each side have an essentially spherical, planoconvex shape. The optical elements 154 and 156 of the embodiment represented in FIG. 16 have an aspherical shape. In the embodiment shown in FIG. 17, the optical elements 180 and 182 pressed together on each side have the form of a Fresnel lens.

Figure 13:
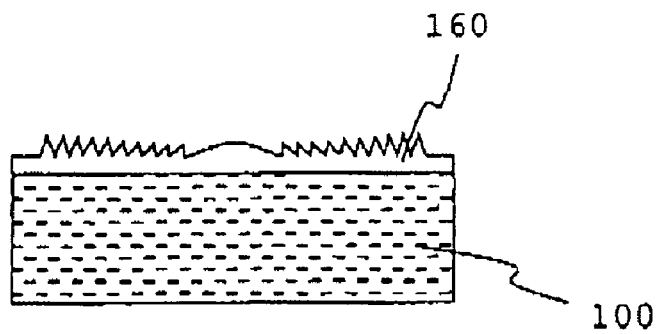
Figure 18:
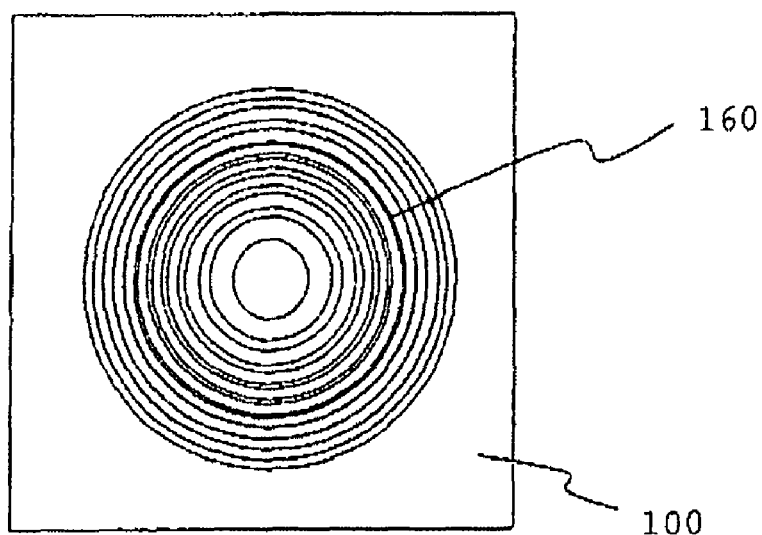
Figure 19:
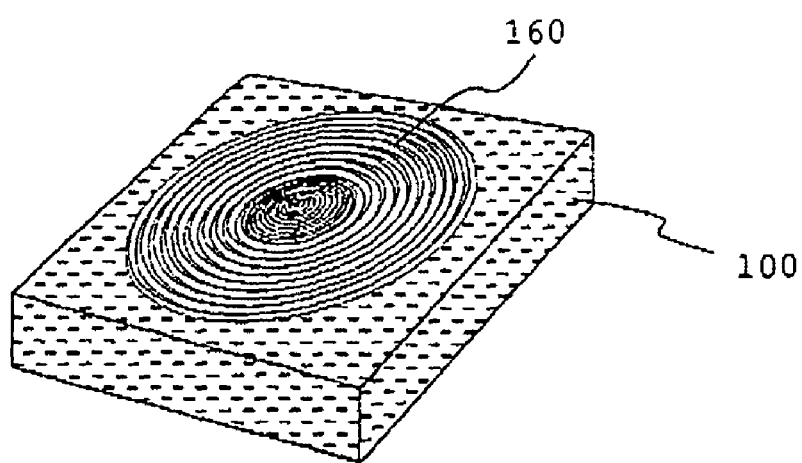

FIGS. 18 and 19 respectively show a plan view and a perspective representation of a microlens obtained by individualization, comprising a Fresnel lens corresponding to FIG. 13.

Figure 20:
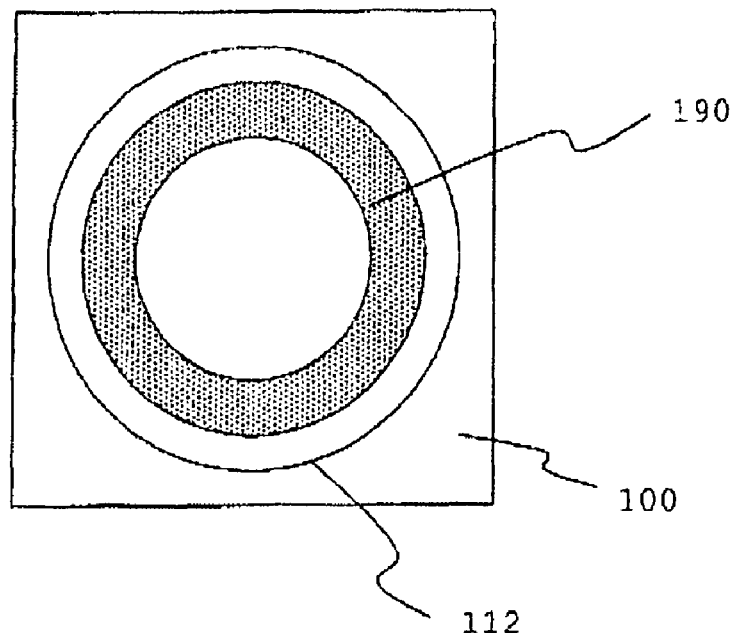
Figure 21:
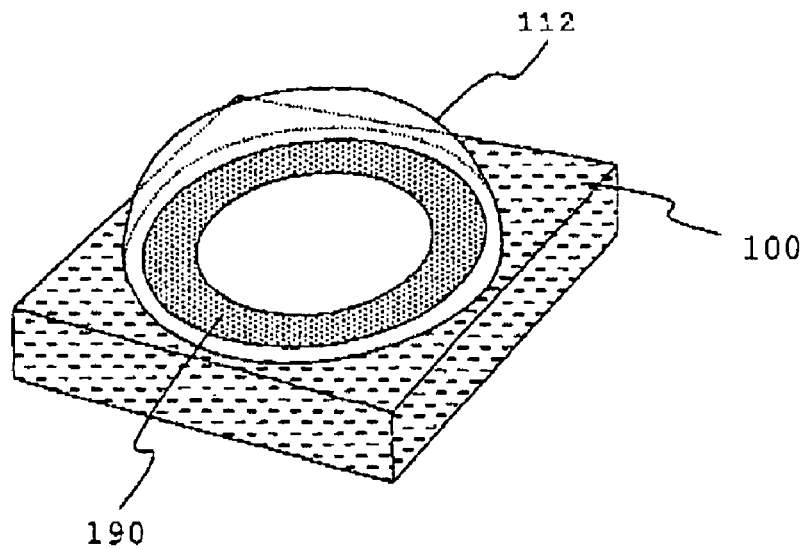

FIGS. 20 and 21 likewise show a plan view and a perspective representation of a microlens obtained by individualization. This particularly preferred embodiment of an optical component according to the invention comprises a photostructured glass substrate 100 and a spherical lens 112 connected to it. Spherical aberrations can in particular be corrected in a straightforward way by suitable structuring 190 in an annular region of the photosensitive glass substrate 100, which corresponds to the edge regions of the spherical lens.

FIGS. 22 to 25 show various preferred arrangements of microlenses of a microlens array.

Figure 22:
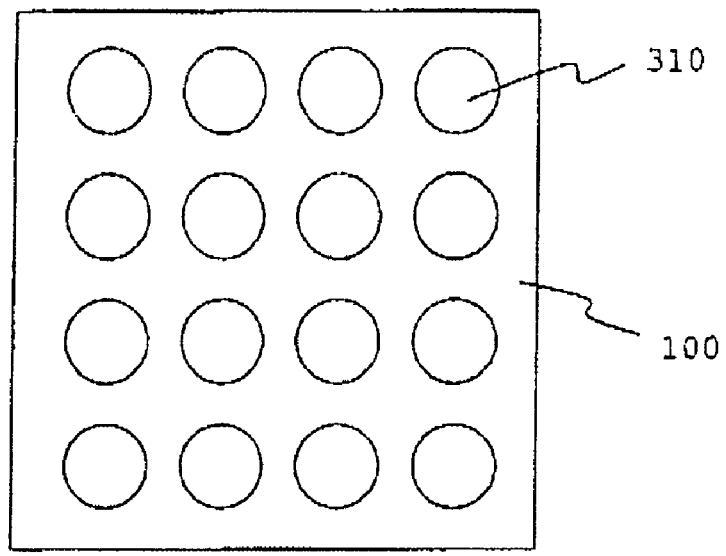

In the arrangement represented in FIG. 22, the essentially spherical microlenses 110 are arranged in rows on the support glass 100. An intermediate space is provided between the individual microlenses, which facilitates individualization of the microlenses of the array.

Figure 23:
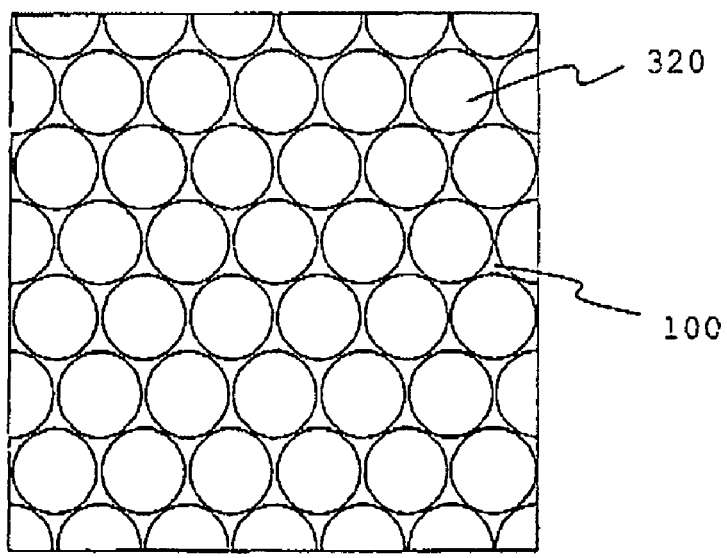

FIG. 23 shows another arrangement of spherical microlenses 320, in which the microlenses 320 are arranged offset on a support glass 100. Owing to the efficient utilization of space, such an arrangement may be preferable for use of the microlens array in optical image sensors or displays.

Figure 24:
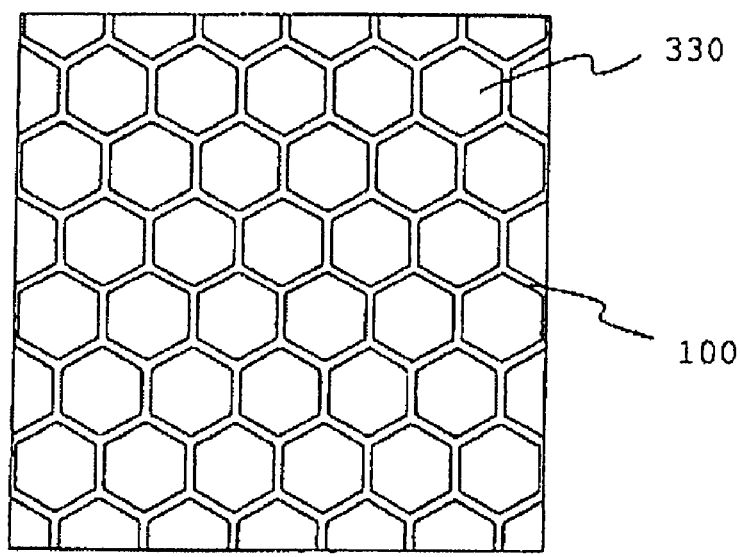
Figure 25:
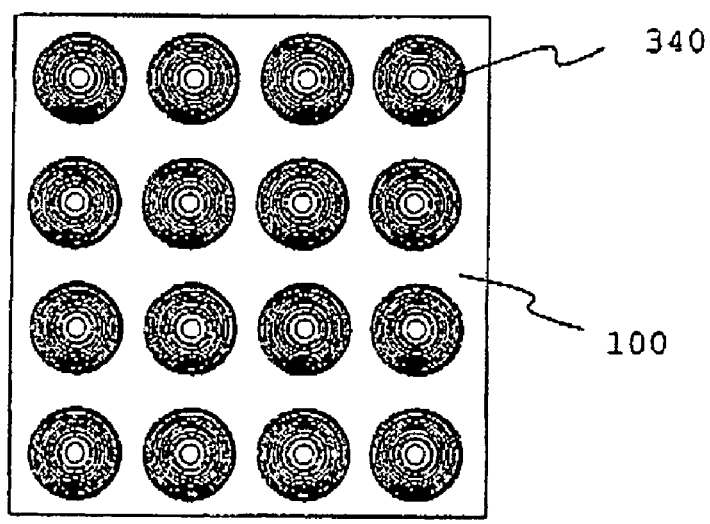

The arrangement shown in FIG. 24 has virtually maximum utilization of space owing to hexagonal microlenses 330. FIG. 25 shows a microlens array having Fresnel microlenses 340 arranged in rows on a support glass 100.

The glass substrate 100 itself may of course already be shaped as a lens. The spatial dimensions of a hybrid lens according to the invention may naturally also lie in a range other than the micrometer range of microlenses, and may for example lie in the range of a few centimeters for use in photography.

Figure 26A:
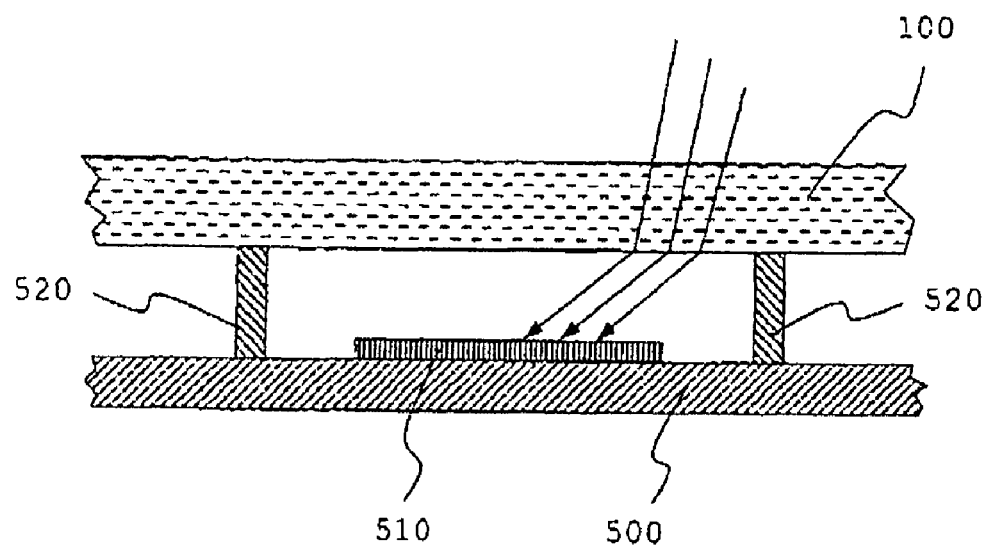
Figure 26B:
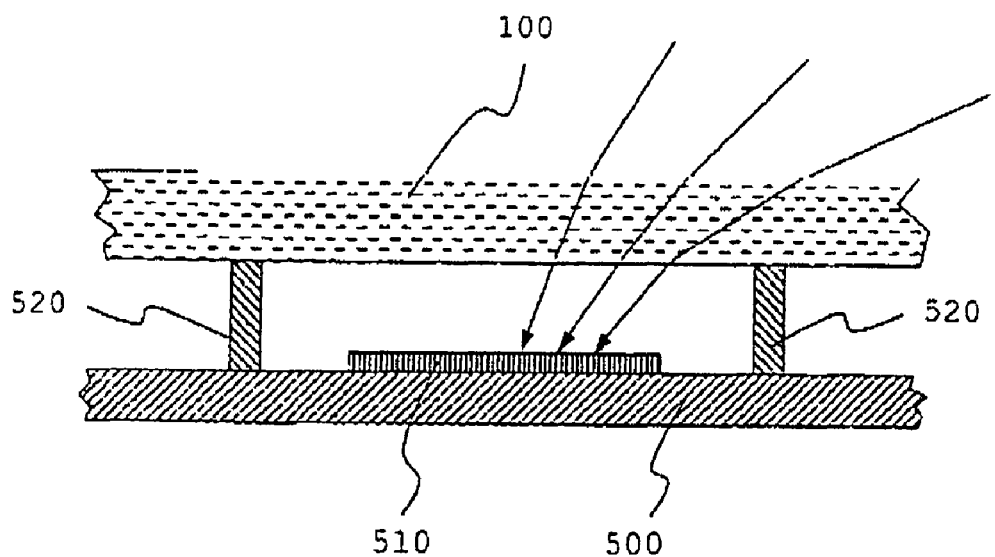

FIGS. 26a and 26b represent an optical image sensor according to the invention, which has a CMOS sensor 510 arranged on a substrate 500. An optical element 100, which comprises a photosensitive glass and has a diffractive optical element generated by photostructuring, is connected to the substrate 500 via spacing and shielding elements 520.

The diffractive optical element generated by photostructuring is used to deviate incoming light radiation from different solid angles onto the optical sensor.

| List of References | |
|---|---|
| 1 | cylinder lens |
| 2 | quasi-cylindrical surface |
| 3 | plane surface |
| 4 | upper plane surface |
| 5 | lower plane surface |
| 6 | diffractive optical element |
| 7-9 | detector |
| 10-15 | diode laser |
| 16, 17 | functional element |
| 18 | surface of the support body |
| 19 | support body |
| 20 | high-power diode laser array |
| 21 | step surface |
| 22 | line on which the diode lasers are arranged |
| 23 | further diffractive element |
| 24 | plane of the further diffractive element |
| 31 | composite optical element, produced by pressing above the transformation temperature of one of the elements |
| 32 | composite optical element produced by low temperature bonding |
| 40 | laser output with back-reflection |
| 50 | laser output without back-reflection |
| 60 | thermal drift |
| 100 | photosensitive glass or glass ceramic |
| 101 | exposure step |
| 102 | first heat treatment step |
| 103 | second heat treatment step |
| 104 | further exposure and heat treatment step |
| 105 | photostructured region |
| 106 | $Ag^+$ |
| 107 | $Ag^0$ |
| 108 | NaF crystals |
| 109 | NaF crystals with metallic silver deposited on them |
| 110, 112 | convex microlens |
| 120 | concave microlens |
| 125 | aspherical microlens |
| 150, 152 | convex microlenses arranged on each side |
| 154, 156 | aspherical microlenses arranged on each side |
| 160 | Fresnel microlens |
| 170, 172 | Fresnel microlens system |
| 180, 182 | Fresnel microlenses arranged on each side |
| 190 | annular photostructured region |
| 200 | mask |
| 310 | microlenses arranged in rows |
| 320 | microlenses arranged offset |
| 330 | hexagonal microlens |
| 340 | Fresnel microlenses arranged in rows |
| 400 | structured photosensitive glass or glass ceramic |
| 410 | photostructured region in the form of a grating |
| 500 | silicon substrate |
| 510 | CMOS sensor |
| 520 | spacing and shielding element |
| 600 | laser radiation |
| H | principal optical ray |
| $L_d$, $L_{d2}$ | optical longitudinal axis of a diffractive optical element |
| $L_r$ | optical longitudinal axis of a refractive element |

The invention claimed is:

1. An optical component comprising:
a first optical element including a first photosensitive glass having a first transformation temperature and a plurality of structures, the plurality of structures influencing light propagation; and
a second optical element having a second glass having a second transformation temperature, the first transformation temperature having a higher value than the second transformation temperature,
the first photosensitive glass and the second glass being formed as a single composite element by heating the second optical element to a temperature above the second transformation temperature but below the first transformation temperature and to a temperature at which the second glass has a viscosity of less than $10^{10}$ dPa·s and then pressing the first and second optical elements together with a pressure above atmospheric pressure while the second element has the viscosity of less than $10^{10}$ dPa·s.

2. The optical component as claimed in claim 1, wherein the plurality of structures are formed by blank pressing followed by photostructuring.

3. The optical component according to claim 1, wherein the first photosensitive glass has a blank pressed surface.

4. The optical component as claimed in claim 1, wherein the first photosensitive glass has refractive index changes.

5. The optical component as claimed in claim 1, wherein the first photosensitive glass has a surface produced by pressing under the action of heat, and wherein the plurality of structures are produced by exposure.

6. The optical component as claimed in claim 1, wherein the first photosensitive glass comprises an oxidic glass that has a transmission band in at least a portion of a visible spectral range.

7. The optical component as claimed in claim 1, wherein the first photosensitive glass comprises a chalcogenide glass that has a transmission band in at least a portion of an infrared spectral range.

8. The optical component as claimed in claim 1, wherein the first photosensitive glass comprises photosensitive alkali aluminosilicate glass.

9. The optical component as claimed in claim 8, wherein the first photosensitive glass is doped with $Ag_2O$ and $CeO_2$.

10. The optical component as claimed in claim 8, wherein the first photosensitive glass comprises the following composition in weight percent:

| | |
|---|---|
| $SiO_2$ | 20 to 80; |
| $Ag_2O$ | 0.01 to 0.4; |
| $CeO_2$ | 0.01 to 0.4; |
| $Sb_2O_3$ | 0 to 1; |
| $B_2O_3$ | 0 to 5; |
| $Al_2O_3$ | 3 to 25; |
| $Li_2O$ | 0 to 15; |
| $Na_2O$ | 1 to 25; |
| $K_2O$ | 0 to 5; |
| ZnO | 1 to 10; |
| MgO | 0 to 5; |
| CaO | 0 to 5; |
| BaO | 0 to 10; |
| $Br_2$ | 0 to 5; |
| $F_2$ | 0 to 5; |
| $P_2O_5$ | 0 to 7; |
| $ZrO_2$ | 0 to 10; |
| $As_2O_3$ | 0 to 2; |
| $TiO_2$ | 0 to 5; |
| $Gd_2O_3$ | 0 to 20; |
| $La_2O_3$ | 0 to 12; and |
| $Ta_2O_5$ | 0 to 15. |

11. The optical component as claimed in claim 8, wherein the first photosensitive glass comprises the following composition in weight percent:

| | |
|---|---|
| $SiO_2$ | 53 to 72; |
| $Ag_2O$ | 0.02 to 0.2; |
| $CeO_2$ | 0.02 to 0.06; |
| $Sb_2O_3$ | 0 to 0.6; |
| $B_2O_3$ | 0 to 3; |
| $Al_2O_3$ | 4 to 20; |
| $Li_2O$ | 0 to 10; |
| $Na_2O$ | 1 to 20; |
| $K_2O$ | 0 to 5; |
| ZnO | 1 to 10; |
| MgO | 0 to 5; |
| CaO | 0 to 4; |
| BaO | 0 to 8; |
| $Br_2$ | 0 to 5; |
| $F_2$ | 0 to 4; |
| $P_2O_5$ | 0 to 5; |
| $ZrO_2$ | 0 to 6; |
| $As_2O_3$ | 0 to 2; |
| $TiO_2$ | 0 to 4; |
| $Gd_2O_3$ | 0 to 18; |
| $La_2O_3$ | 0 to 10; and |
| $Ta_2O_5$ | 0 to 13. |

12. The optical component as claimed in claim 8, wherein the first photosensitive glass comprises the following composition in weight percent:

| | |
|---|---|
| $SiO_2$ | 55 to 70; |
| $Ag_2O$ | 0.03 to 0.1; |
| $CeO_2$ | 0.02 to 0.04; |
| $Sb_2O_3$ | 0 to 0.6; |
| $B_2O_3$ | 0 to 3; |
| $Al_2O_3$ | 4 to 12; |
| $Li_2O$ | 0 to 6; |
| $Na_2O$ | 1 to 17; |
| $K_2O$ | 0 to 4; |
| ZnO | 1 to 10; |
| MgO | 0 to 4; |
| CaO | 0 to 4; |
| BaO | 0 to 6; |
| $Br_2$ | 0 to 4; |
| $F_2$ | 0 to 3; |
| $P_2O_5$ | 0 to 4; |
| $ZrO_2$ | 0 to 5; |
| $As_2O_3$ | 0 to 2; |
| $TiO_2$ | 0 to 3; |
| $Gd_2O_3$ | 0 to 15; |
| $La_2O_3$ | 0 to 8; and |
| $Ta_2O_5$ | 0 to 10. |

13. The optical component as claimed in claim 8, further comprises sensitizers and/or activators for photostructuring.

14. The optical component as claimed in claim 8, wherein the first photosensitive glass further comprises photosensitive elements selected from the group consisting of Cu, Ag, Au, and $Ce^{3+}$.

15. The optical component as claimed in claim 8, wherein the first photosensitive glass further comprises halides for photostructuring selected from group consisting of F, Br, Cl, and I.

16. The optical component as claimed in claim 1, wherein the first photosensitive glass has a refractive index modulation of at least $10^{-4}$.

17. The optical component as claimed in claim 16, wherein the refractive index modulation is generated by a process selected from the group consisting of laser structuring, UV laser structuring, and fs IR laser structuring.

18. The optical component as claimed in claim 1, further comprising a fast axis collimating lens and a first diffractive optical element, wherein said first diffractive optical element is defined at least in part by a refractive index modulation of the first photosensitive glass.

19. The optical component as claimed in claim 18, wherein the fast axis collimating lens comprises a cylinder lens having a refractive optical element.

20. The optical component as claimed in claim 19, further comprising a second diffractive optical element arranged on the refractive optical element.

21. The optical component as claimed in claim 20, wherein the second diffractive optical element is arranged in a plane lying opposite a refractive surface of the refractive optical element.

22. The optical component as claimed in claim 21, wherein the first and/or second diffractive elements together with the refractive surface defines an aspherical cylinder lens.

23. The optical component as claimed in claim 19, further comprising a diffractive element for the production of a multi-lens imaging system.

24. The optical component as claimed in claim 18, wherein the fast axis collimating lens comprises a cylinder lens having an aspherical surface.

25. The optical component as claimed in claim 24, wherein the cylinder lens is a fast axis collimating lens assigned to at least one semiconductor laser in a semiconductor array.

* * * * *